Figure 1:
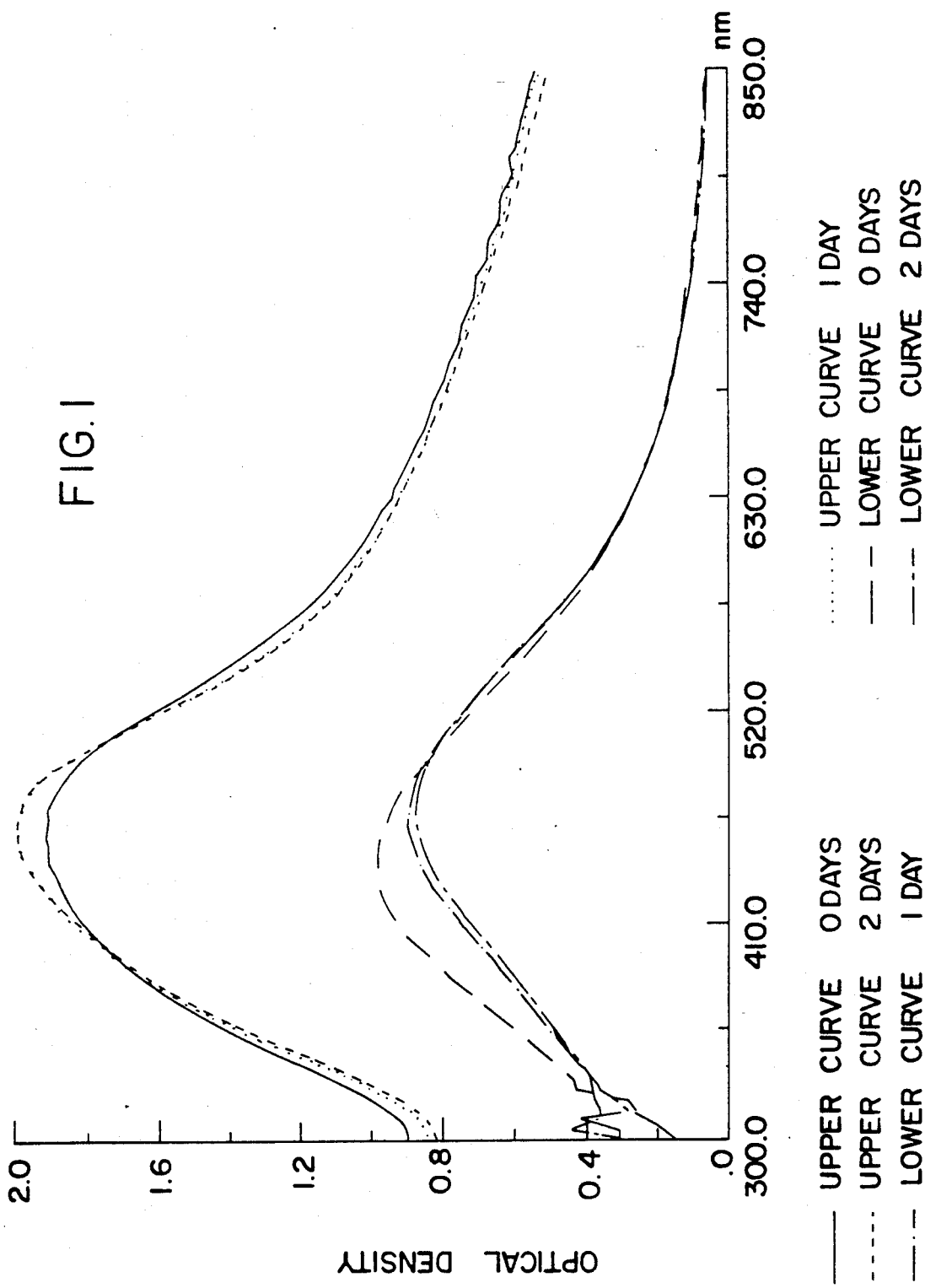

United States Patent [19]
Smoot et al.

[11] Patent Number: 5,114,813
[45] Date of Patent: May 19, 1992

[54] METHOD OF FORMING STABLE IMAGES IN ELECTRON BEAM WRITABLE GLASS COMPOSITIONS

[75] Inventors: Stephen W. Smoot, Wilkes-Barre; Joseph S. Hayden, Clarks Summit, both of Pa.; Marc Clement, Mainz, Fed. Rep. of Germany; Danuta Grabowski, Taunusstein, Fed. Rep. of Germany; Eva Holzel, Ober-Olm, Fed. Rep. of Germany; Peter Nass, Mainz, Fed. Rep. of Germany; Martin Heming, Saulheim, Fed. Rep. of Germany

[73] Assignee: Schott Glass Technologies, Inc., Duryea, Pa.

[21] Appl. No.: 476,051

[22] Filed: Feb. 8, 1990

Related U.S. Application Data

[63] Continuation-in-part of Ser. No. 369,997, Jun. 23, 1989.

[51] Int. Cl.⁵ .......................... G03C 5/00; G11B 7/00
[52] U.S. Cl. .......................................... 430/5; 430/13; 430/14; 430/19; 430/270; 430/296; 430/321; 428/410; 428/426; 65/30.11
[58] Field of Search ............... 430/13, 14, 19, 270, 430/5, 296, 321; 428/410, 426; 65/30.11

[56] References Cited

U.S. PATENT DOCUMENTS

| | | | |
|---|---|---|---|
| 4,191,547 | 3/1980 | Wu | 65/30 |
| 4,297,417 | 10/1981 | Wu | 430/19 |
| 4,337,295 | 6/1982 | Rittler | 428/426 |
| 4,567,104 | 1/1986 | Wu . | |
| 4,670,366 | 6/1987 | Wu . | |
| 4,726,981 | 2/1988 | Pierson et al. | 428/426 |
| 4,798,768 | 1/1989 | Oversluizen et al. | 428/426 |
| 4,894,303 | 1/1990 | Wu . | |
| 4,897,509 | 1/1990 | Holleran et al. | 428/426 |
| 4,979,975 | 12/1990 | Borrelli et al. | 65/30.11 |

Primary Examiner—Charles L. Bowers, Jr.
Assistant Examiner—John A. McPherson
Attorney, Agent, or Firm—Millen, White & Zelano

[57] ABSTRACT

Silicate glasses are provided which when exposed to a silver ion exchange surface treatment are writable with electron beams. These glasses contain OD agents and do not require elements having 1-4 d-electrons in the atomic state.

28 Claims, 9 Drawing Sheets

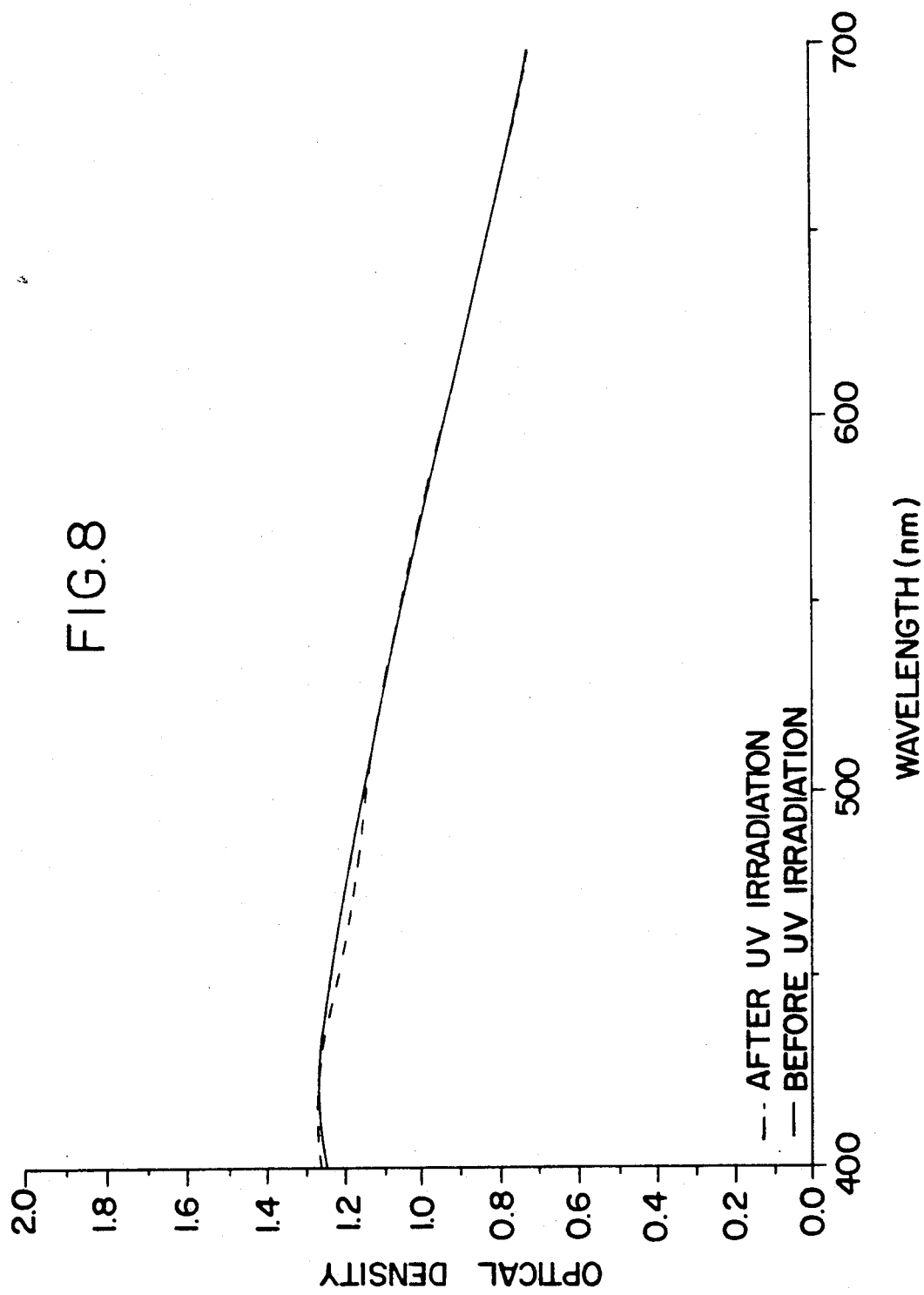

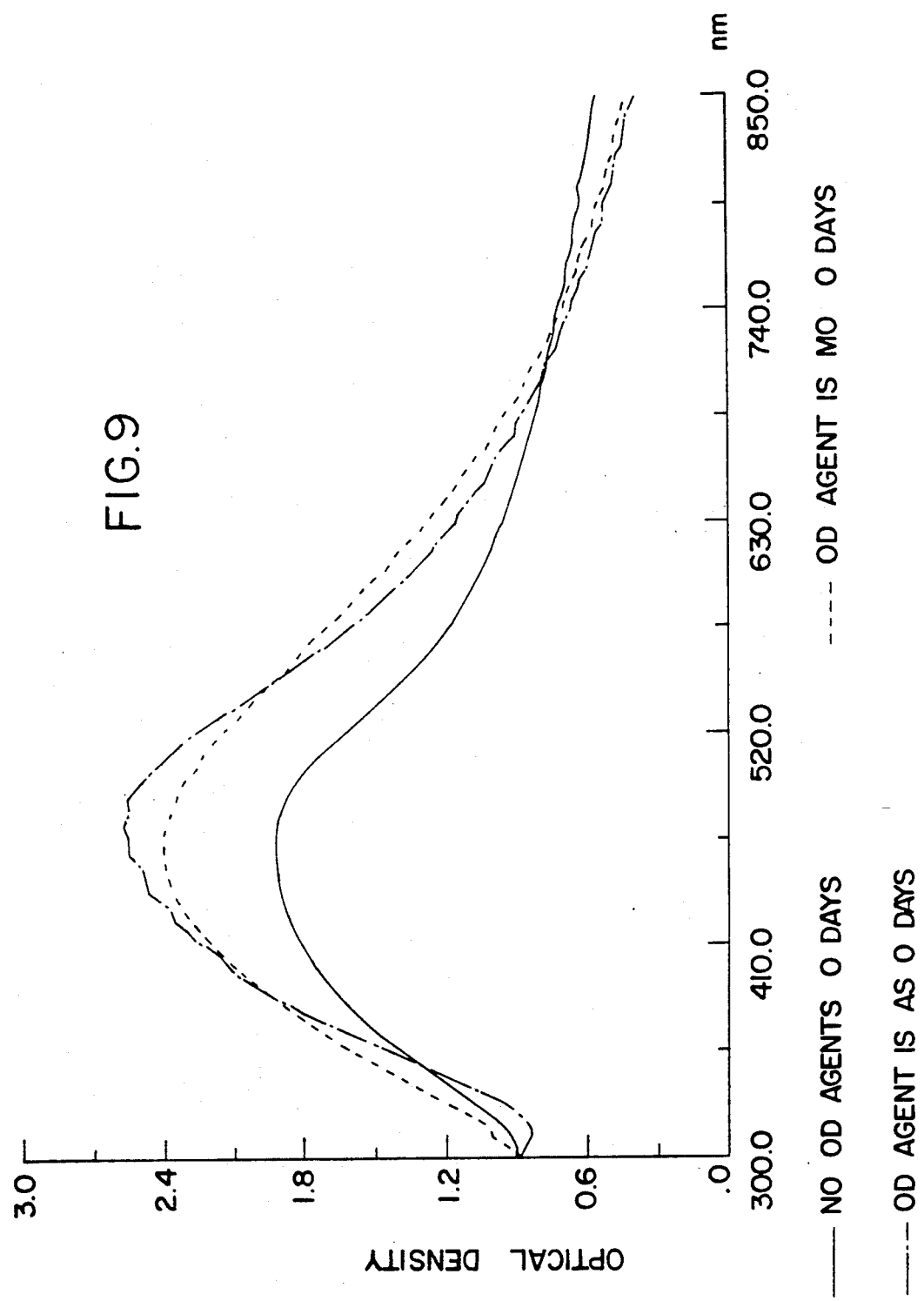

METHOD OF FORMING STABLE IMAGES IN ELECTRON BEAM WRITABLE GLASS COMPOSITIONS

CROSS-REFERENCE TO RELATED APPLICATION

This application is a continuation-in-part of U.S. Ser. No. 07/369,997, now allowed, filed on June 23, 1989, which is incorporated by reference herein.

BACKGROUND OF THE INVENTION

This invention relates to new glass articles having energy-sensitive portions which can be written by high-energy beams to record stable images.

Various devices are known for archival storage media. These include magnetic materials, etched chrome masks, and many others. Attempts have also been made to use glass for such applications. However, further improvements are still desired.

SUMMARY OF THE INVENTION

This invention is based on the surprising discovery that silicate glass compositions, hydrated and containing silver, can be effectively written with high-energy beams, e.g., electron beams, to produce high-optical-density images. These advantageous properties can be achieved, surprisingly, with essentially no content in such compositions of transition metals having 1–4 d-electrons in the atomic state. Accordingly, this invention relates to a silicate glass article comprising the following silicate glass composition in mole %:

| | |
|---|---|
| $SiO_2$ | 30-95 |
| $P_2O_5$ | 0-20 |
| $B_2O_3$ | 0-30 |
| $Al_2O_3$ | 0-40 |
| RO | 0-40 |
| $R_2O$ | 1-35 |
| OD agent | 0.01-10 |
| halide | 0-10 | and essentially no transition metals having 1–4 d-electrons in the atomic state,
wherein
RO is MgO, CaO, SrO, BaO, ZnO and/or PbO,
$R_2O$ is $Li_2O$, $Na_2O$, $K_2O$, $Rb_2O$ and/or $Cs_2O$,
halide is Cl, F, Br and/or I,
"OD agent" (optical density agent) is one or more metals which do not possess 1–4 d-electrons in the atomic state and which can have at least two stable oxidation (valence) states (other than the atomic state) in the silicate glasses of this invention,
at least one surface of said article having a substantially continuous silver and hydration content over its area, effective to render said surface darkenable upon exposure to electron beam radiation but preferably substantially not thermoplastic,
said article preferably having been substantially darkened by electron beam irradiation over at least a portion of at least one surface thereof,
and said article preferably having geometric characteristics suitable for functioning as a photomask reticle, optical disk or similar archival storage medium.

In another aspect, this invention relates to a silicate glass article comprising the following silicate glass composition in mole %:

| | |
|---|---|
| $SiO_2$ | 30-95 |
| $P_2O_5$ | 0-20 |
| $B_2O_3$ | 0-30 |
| $Al_2O_3$ | 0-40 |
| RO | 0-40 |
| $R_2O$ | 1-35 |
| OD agent | 0.01-10 |
| halide | 0-10 | and essentially no transition metals having 1–4 d-electrons in the atomic state,
wherein
RO is MgO, CaO, SrO, BaO, ZnO and/or PbO,
$R_2O$ is $Li_2O$, $Na_2O$, $K_2O$, $Rb_2O$ and/or $Cs_2O$,
halide is Cl, F, Br and/or I,
OD agent is one or more metals which do not possess 1–4 d-electrons in the atomic state and which can have at least two stable oxidation (valence) states (other than the atomic state) in the silicate glasses of this invention
at least one surface of said article having a substantially continuous silver and hydration content over its area, effective to render said surface darkenable upon exposure to electron beam radiation but preferably substantially not thermoplastic,
said article preferably substantially not exhibiting alterable photo-anisotropic effects induced by actinic UV radiation,
and said article preferably having geometric characteristics suitable for functioning as a photomask reticle, optical disk or similar archival storage medium.

In a further aspect, this invention relates to a silicate glass article comprising an amount of $SiO_2$ effective as a network former and essentially no transition metals having 1–4 d-electrons in the atomic state, and
at least one surface of said article having a substantially continuous silver and hydration content over its area, effective to render said surface darkenable upon exposure to electron beam radiation but preferably substantially not thermoplastic,
said article preferably having been substantially darkened by electron beam irradiation over at least a portion of at least one surface thereof,
and said article preferably having geometric characteristics suitable for functioning as a photomask reticle, optical disk or similar archival storage medium.

In yet a further aspect, this invention relates to a silicate glass article comprising an amount of $SiO_2$ effective as a network former and essentially no transition metals having 1–4 d-electrons in the atomic state, and
at least one surface of said article having a substantially continuous silver and hydration content over its area, effective to render said surface darkenable upon exposure to electron beam radiation but preferably substantially not thermoplastic,
said article preferably substantially not exhibiting alterable photo-anisotropic effects induced by actinic UV radiation,
and said article preferably having geometric characteristics suitable for functioning as a photomask reticle, optical disk or similar archival storage medium.

In other aspects, this invention relates to methods of forming an image readable by actinic radiation, e.g., UV or visible radiation, comprising writing such an image in a glass article of this invention by electron-beam irradiation thereof. The invention also relates to reading the resultant image. The invention further relates to methods of erasing such images by heating of the glass articles containing the images.

In other aspects of this invention, there can be included in the glass, transition metals having 1-4 d-electrons in the atomic state, preferably Ti and/or Zr but also others, in total amounts less than 0.5 mole %, or in total amounts less than the minimum amount of such metals or combinations thereof effective as RSS and/or PI agents in a given glass, or in total amounts effective as RSS and/or PI agents when an OD agent is also included in the glass which is a metal not included in the glasses of U.S. Pat. Nos. 4,670,366 and/or 4,567,104, e.g., those OD agents of this invention except for Cu and/or Ce. RSS and PI agents are defined in the latter two U.S. patents, both of which are entirely incorporated by reference herein. Amounts of any metal for any such purpose can be determined routinely.

This invention also relates to various other aspects and features as described below.

OD agents are metals which do not possess 1-4 d-electrons in the atomic state and which have at least two stable oxidation (valence) states (other than the atomic state) in the silicate glasses of this invention. An oxidation (valence) state is considered "stable" per this invention if the element can exist in that valence in any silicate glass of this invention. Typically, the oxidation states of a metal in a glass will be in equilibrium with each other.

Preferred OD agents amplify the darkening (optical density) effected (written) in the glasses of this invention by irradiation (e.g., by e-beam). Amplification refers to an increase in optical density at a given range of wavelengths and at a given point in time after writing, for a given glass of this invention with respect to the same glass without the OD agent and/or with respect to the same glass having an RSS and/or PI agent in place of the OD agent, in all cases for equivalent activating surface treatments as discussed below.

OD agents are generally used in amounts of 0.01 to 10 mole %, precise amounts for a given composition being routinely determinable and being bound at the upper end by the solubility limit of the particular OD agent, of course. Preferred amounts are 0.05 or 0.07 to 10 mole %, most preferably 0.1 to 5 mole %. OD metals include, for example, one or more metals selected from Sb, As, Ce, Cr, Bi, Co, Cu, Eu, Ga, Ge, In, Fe, Mn, Mo, Pb, Ni, Pr, Se, Sm, Te, Tb, Sn and/or Yb. This list is not exhaustive and is non-limiting. Other metals exist which meet the definition of OD agents of this invention and are included in the invention.

The most preferred OD agent is Mo. Further preferred are As and Sn. Both effect amplification as defined herein.

Some OD agents can also serve other functions. For example, Ge can be used as a replacement for network former Si (e.g., up to 5 mole %) and Ga and/or In can be used as a replacement for Al (e.g., up to 5 mole %), both with or without OD effect, depending on the particular glass involved, as routinely determinable by preliminary experiments. Similarly, As and Sb can be included, e.g., in amounts up to 1 mole % for refining purposes with or without effect.

Some of the polyvalent OD agents can cause a coloration of the glass when included or a darkening thereof, e.g., after the surface treatment discussed herein (before or after the optional subsequent heat treatment). For example, one mechanism for this effect can be donation of electrons by the polyvalent species (e.g., As, Sb, Sn, Bi, etc.) to silver ions entering the glass structure during ion exchange. When this occurs, there will be an increase in the extent to which silver ions are reduced to silver metal precipitates during ion exchange.

Preferred OD agents are those which do not impart coloration to the glass or those used in amounts not imparting coloration to the glass. Similarly preferred, where included, will be noncoloring transition metals having 1-4 d-electrons in the atomic state, or amounts thereof which are noncoloring. Preferred are Ti and/or Zr. Furthermore, preferred will be those OD agents or, where included, transition metals having 1-4 d-electrons in the atomic state which do not darken after the surface treatment discussed below used to produce the writable surface having the mentioned silver and hydration content. However, when OD and/or transition metals having 1-4 d-electrons in the atomic state are used in amounts imparting color to the glass or causing darkening after or during the surface treatment, the resultant glasses are still part of this invention as long as these glasses can be substantially further darkened by e-beams, preferably to provide sufficient contrast (compared to the optical density of the glass (e.g., at 436 nm) before e-beam irradiation) for subsequent reading by UV or visible radiation of an e-beam written image, most preferably sufficient for use of the resultant glass article as an archival storage medium.

Where optical density after writing continues to increase with time, the kinetics of this change can be routinely accelerated as expected for a kinetic phenomenon, i.e., by a temperature increase, e.g., by a heat treatment, e.g., in the range of 90°-110° C. for 20-28 hours, higher and lower values being applicable, preferably after writing on the surface treated with a silver exchange solution. Optimum conditions can be routinely determined for a given glass article.

Which compositions display amplification as defined above can be routinely determined in view of this disclosure perhaps with a few orientation experiments.

A wide range of silicate glass compositions is applicable for this invention. Within the broadly defined ranges mentioned herein, the included "silicate" glass compositions will be those wherein the amounts of all components are such that $SiO_2$ is one network former. These will also be adequate to provide a silicate glass having the necessary characteristics for a given application and contain therein at least one surface which has a content of silver and is hydrated, typically substantially continuously over the entire area of the surface, such that the resultant hydrated silver composition is sensitive to high-energy radiation such as electron beams to darken under its influence.

The compositions are also preferably to be essentially devoid of all transition metals having 1-4 d-electrons in the atomic state. These include Sc, Ti, V, Y, Zr, Nb, La, Hf, Ta and W. Preferably, the glasses of this invention are also essentially devoid of all metals having 1-4 d-electrons in the atomic state, such as, for example, the relevant lanthanides and actinides, etc.

Within the context of this invention, the term "substantially (or essentially) free of" a component means that the component is not intentionally added to the batch composition for preparation of a glass but, rather, is unavoidably present therein as an impurity in other batch components and, thus, will be present in the final glass composition in trace amounts. Similarly, other impurities can be derived from processing of the glass melt. Nevertheless, it is highly preferred that the glass compositions used in this invention be entirely devoid of transition metals having 1–4 d-electrons in the atomic state, and also all nontransition metals having 1–4 d-electrons in the atomic state. Where the presence of such undesired components, e.g., such metals, is practically unavoidable, the resultant trace amounts should be preferably maintained less than 0.1 mole % if possible; of course, higher amounts can be included where the consequent adverse effects can be tolerated in the end-use.

By the expression "substantially darkened by electron-beam radiation" is meant a degree of darkening which is significantly greater than any inadvertent darkening which might occur, for example, in SEM measurements or analyses of a glass composition. Typically, the degree of darkening will be that which is sufficient for use of any resultant image based on the darkened portions as an archival storage medium as described above. The precise optical density involved will depend on the end-use requirements and can be, for example, equal to or greater than 0.1, 0.5, 1, 1.5, 2, 2.5, 3, and higher, etc.

Thus, the silver-containing surfaces of this invention will typically have silver more or less uniformly and homogeneously distributed continuously over a surface, as opposed to discretely, e.g., in a pattern.

Furthermore, the silver-containing surfaces of this invention preferably do not exhibit any substantial alterable photo-anisotropic effects induced or inducible by actinic UV radiation such as the effects described in U.S. Pat. Nos. 4,191,547, 4,296,479 and 4,297,417, each of which is entirely incorporated by reference herein. Thus, the glass articles of this invention will not be exposed to sufficiently high doses of UV radiation whereby such alterable photo-anisotropic properties could be induced where applicable. Thus, in normal use as an archival storage medium, the glass articles of this invention would be exposed to low-levll UV radiation effective for reading an image in the medium. Typically, many months, on the order of many years, will pass before a sufficient dose of UV radiation has been received by a glass article of this invention to produce any significant alterable photo-anisotropic effects, if ever, for any glass articles of this invention which might somehow inherently be capable of producing such effects Preferably, the glass articles of this invention exhibit essentially no alterable photo-anisotropic effects induced by ny kind of radiation, e.g., e-beam, X-ray, etc.

A preferred composition for use in conjunction with this invention has the following composition in mole %:

| | |
|---|---|
| $SiO_2$ | 40–90 |
| $P_2O_5$ | 0–5 |
| $B_2O_3$ | 0–30 |
| $Al_2O_3$ | 0–15 |
| RO | 5–30 |
| $\Sigma Li_2O, Na_2O, K_2O$ | 5–25 |
| OD agent | 0.1–10 |
| halide | 0–6. |

Most preferably, the amount of OD agent(s) is 0.1–5 mole % or 0.2–5 mole % or 0.5–5 mole %, or 1–5 mole %, higher ranges being more applicable for those OD agents which do not color the glass or render it darkened after the surface treatment described herein.

A most preferred composition for use in this invention has the following composition in mole %:

| | |
|---|---|
| $SiO_2$ | 50–85 |
| $P_2O_5$ | 0–2 |
| $B_2O_3$ | 0–20 |
| $Al_2O_3$ | 0–5 |
| RO | 5–20 |
| $\Sigma Li_2O, Na_2O, K_2O$ | 5–25 |
| OD agent | 0.5–5 |
| Cl | 0.1–6. |

Silica is used in the glasses of this invention as the principal glass former, especially preferred in amounts of 60–75 mole% Levels of silica too low generally result in glasses which possess thermomechanical properties, particularly thermal expansion, or acid durability properties, which are undesirable in applications of the materials of this invention to situations requiring the recording, reading, or transferring of microscopic optical density patterns generated in the material by electron-beam irradiation. High levels of silica impart lower thermal expansion values but decrease the meltability of such compositions.

The addition of $Al_2O_3$ and RO (R=Mg (e.g., 0–11%), Ca (e.g., 0–11%), Sr (e.g., 0–11%), Ba (e.g., 0–11%), Zn (e.g., 0–12%), Pb (e.g., 0–11%)) impart chemical durability to the produced glass compositions and also impart during manufacturing of the glass articles an increased stability and reduced tendency toward crystallization. Zn is preferred, as well as Ca. However, there are limits to the increase of divalent ions, since they can tend toward buildup of barrier layers damaging to the ion exchange at higher concentrations (compare A. Kolitsch et al.: "*Blockage of Ion Exchange of Monovalent Cations by Divalent Cations on Glass Surfaces*", Z. Phys. Chem. 263:877 [1982]; B. Rauschenbach, E. Richter: "*Contribution Toward Blockage of Ion Exchange Processes on Glass Surfaces*", Silikattechn. 33:70 [1982]).

The presence of $R_2O$ (R=Li, Na, K, Rb, Cs) is of particular importance when the materials are to be subjected to an ion-exchange treatment of silver for alkali ions. Levels of alkali ions too low give insufficient ion-exchangeability, whereas levels too high reduce the chemical durability of the produced glasses resulting in the potential chemical attack of glass samples during the ion-exchange treatment. Li (e.g., 0–10 mole%), Na (e.g., 1–15 mole%) and K (e.g., 0–8 mole%) are preferred.

The presence of halides in the produced glass articles, preferably Cl, significantly enhances the sensitivity of such glass articles to electron beams.

As mentioned, in one aspect, the glass compositions of the present invention are free from transition metal oxides having from 1 to 4 d-electrons in the atomic state as these constituents impart to electron beam induced images in the glass an instability with time and temperature which is undesirable for application of these materials as archival storage media. However, in some cases this effect can be so well offset by this invention's stabilization and/or amplification of OD (e.g., by providing an amplification offsetting the OD fade induced by the 1–4 d-electron elements), that some amount of these 1 to 4 d-electron elements can be permitted, e.g., where they provide improved glass properties, or permit facilitated melting or processing. They can also be used for their heretofore known effects on the photosensitivity of the glasses, e.g., to lessen bleaching caused by actinic radiation, e.g., "reading" irradiation at 436 nm and the like. Thus, the amounts of these 1 to 4 d-electron elements can vary from amounts in which they have essentially no substantial effect on photosensitivity properties of the glass to amounts in which they do substantially affect the photosensitivity properties, e.g., act as PI and/or RSS agents as described above.

Where no effect on photosensitivity is involved, these amounts are generally 0.01-less than 0.5 mole %, e.g., up to 0.4 mole %, preferably 0.05-0.2 mole %. Where photosensitivity effects are desired, these amounts are generally 0.5 mole % to 10 mole %, e.g., 1-5 mole %, although for the glasses of this invention amounts lower than 0.5 mole% can also be useful in this regard. However, these ranges can vary with the component involved and with the overall glass composition involved. Precise amounts for a given case can be determined routinely, e.g., with a few preliminary orientation experiments.

Other useful glasses per this invention have the compositions in weight %:

| | | |
|---|---|---|
| (a) | $SiO_2$ | 60-75 |
| | $GeO_2$ | 0-5 |
| | $\Sigma SiO_2 + GeO_2$ | 60-75 |
| | $B_2O_3$ | 2-20 |
| | $P_2O_5$ | 0-5 |
| | $Al_2O_3$ | 0-5 |
| | $Ga_2O_3$ | 0-5 |
| | $\Sigma Al_2O_3 + Ga_2O_3$ | 0-5 |
| | $Li_2O$ | 0-2 |
| | $Na_2O$ | 0-10 |
| | $K_2O$ | 1-15 |
| | $\Sigma Li_2O + Na_2O + K_2O$ | 1-15 |
| | MgO | 0-1 |
| | CaO | 0-1 |
| | SrO | 0-1 |
| | BaO | 0-10 |
| | ZnO | 0-12 |
| | PbO | 0-10 |
| | $\Sigma CaO + SrO + BaO + ZnO + PbO$ | 0-25 |
| | $TiO_2$ | 0-0.4 |
| | $ZrO_2$ | 0-1 |
| | $SnO_2$ | 0-5 |
| | $CeO_2$ | 0-5 |
| | $As_2O_3$ | 0-1 |
| | $Sb_2O_3$ | 0-1 |
| | $Bi_2O_3$ | 0-7 |
| | $\Sigma SnO_2 + CeO_2 + As_2O_3 + Sb_2O_3 + Bi_2O_3 + PbO$ | 0.01-10 (mole %) |
| | $F^-$ | 0-2 |
| | $Cl^-$ | 0-2 |
| | $(NO_3^- + NO_2^-)$ | 0-2 |
| (b) | $SiO_2$ | 66-71 |
| | $GeO_2$ | 0-5 |
| | $\Sigma SiO_2 + GeO_2$ | 66-71 |
| | $B_2O_3$ | 2-3 |
| | $P_2O_5$ | 0-5 |
| | $Al_2O_3$ | 1-2 |
| | $Ga_2O_3$ | 0-2 |
| | $\Sigma Al_2O_3 + Ga_2O_3$ | 1-2 |
| | $Li_2O$ | 1-2 |
| | $Na_2O$ | 5-7 |
| | $K_2O$ | 4.5-6 |
| | $\Sigma Li_2O + Na_2O + K_2O$ | 10-15 |
| | ZnO | 9-11 |
| | $ZrO_2$ | 0-1 |
| | PbO | 0-10 |
| | $SnO_2$ | 0.2-5 |
| | $Cl^-$ | 0-2 |
| (c) | $SiO_2$ | 60-75 |
| | $GeO_2$ | 0-5 |
| | $\Sigma SiO_2 + GeO_2$ | 60-75 |
| | $B_2O_3$ | 2-15 |
| | $P_2O_5$ | 0-5 |
| | $Al_2O_3$ | 0-3 |
| | $Ga_2O_3$ | 0-3 |
| | $\Sigma Al_2O_3 + Ga_2O_3$ | 0-3 |
| | $Li_2O$ | 0-2 |
| | $Na_2O$ | 1-10 |
| | $K_2O$ | 1-10 |
| | $\Sigma Li_2O + Na_2O + K_2O$ | 1-20 |
| | ZnO | 0-11 |
| | PbO | 0-10 |
| | $CeO_2$ | 0.2-5 |
| | $As_2O_3$ | 0-1 |
| | $Sb_2O_3$ | 0-1 |
| | $Bi_2O_3$ | 0-7 |
| | $\Sigma PbO + CeO_2 + As_2O_3 + Sb_2O_3 + Bi_2O_3$ | 0.01-10 (mole %) |
| | $Cl^-$ | 0-2 |
| | $(NO_3^- + NO_2^-)$ | 0-2 |
| (d) | $SiO_2$ | 62-70 |
| | $GeO_2$ | 0-5 |
| | $\Sigma SiO_2 + GeO_2$ | 62-70 |
| | $B_2O_3$ | 10-20 |
| | $P_2O_5$ | 0-5 |
| | $Al_2O_3$ | 0-3 |
| | $Ga_2O_3$ | 0-3 |
| | $\Sigma Al_2O_3 + Ga_2O_3$ | 0-3 |
| | $Li_2O$ | 0-1 |
| | $Na_2O$ | 0-11 |
| | $K_2O$ | 1-15 |
| | $\Sigma Li_2O + Na_2O + K_2O$ | 1-25 |
| | MgO | 0-1 |
| | CaO | 0-1 |
| | SrO | 0-1 |
| | BaO | 0-10 |
| | ZnO | 0-1 |
| | PbO | 0-1 |
| | $\Sigma CaO + SrO + BaO + ZnO + PbO$ | 0-15 |
| | $TiO_2$ | 0-0.4 |
| | $SnO_2$ | 0-5 |
| | $\Sigma PbO + SnO_2$ | 0.01-10 (mole %) |
| | $Cl^-$ | 0-2 |
| | $F^-$ | 0-1 |

The glass articles of this invention can comprise a single composition overall having a silicate base composition, essentially homogeneously and uniformly containing a silver and hydration content. Alternatively, the glass articles can comprise a bulk portion consisting essentially of the base silicate composition. This bulk portion can have a surface layer consisting of essentially the same (or even a different) silicate glass composition having the mentioned silver and hydration content. The layer can be coated onto the bulk portion or can be monolithic therewith, e.g., prepared by suitable treatment of a surface of the bulk composition-based glass article per se.

The glass articles of this invention, of course, will have other characteristics necessary or desirable for the intended end-use. Thus, they will be substantially nonthermoplastic so that they provide surfaces which have sufficient rigidity and integrity for the intended applications, such as use in archival storage, e.g., photomasks, optical disks, optical elements such as diffraction gratings, gunsights, etc. For example, the glass articles of this invention will have surfaces, especially writable surfaces, which are not "thermoplastic" as defined in U.S. Pat. No. 4,160,654, which is entirely incorporated by reference herein. Thus, the articles of this invention will not be capable of thermoplastic molding, pressing or extrusion. They will be nonthermoplastic in the sense that highly sensitive measurements of the nature of the surface before hydration (e.g., interferometrically with a sensitivity/accuracy of at least 5 μm) will show no significant or substantial difference in surface quality after hydration treatment. The surfaces will be substantially nondeformable under conditions conventionally employed to deform glass surfaces defined as being "thermoplastic." After the surface treatment, they show no appreciable increase in the deformability customarily used nowadays for shaping surfaces.

Similarly, the glass articles of this invention will have geometric characteristics which are necessary or desirable for the intended end-use. Thus, where the article is to be employed as a photomask or optical disk or similar archival storage medium, it will generally have a high degree of flatness on the written surface and typically be in the form of a rectangular or disk-shaped plate. These characteristics will be satisfactory to meet relevant industry specifications. Consequently, prior art silver-containing silicate surfaces of optical waveguides, optical fibers and similar structures are not included in the scope of this invention.

The glass articles of this invention can be used in all applications in whatever form where information, in whatever form, is stored in a solid body or solid body layer by exploiting contrast differences, e.g., in a wavelength range of about 200 nm to about 1000 nm.

Essentially any known method for achieving hydration and silver contents in silicate glasses can be employed to prepare the glass articles of this invention. These include standard salt bath ion exchanges (see, e.g., U.S. Pat. No. 3,528,847), the well known combination hydration and silver ion-exchange treatments (see, e.g., U.S. Pat Nos. 4,160,654, 4,191,547 and 4,297,417, incorporated by reference above, Schroeder et al., Naturwiss. 57:533-541 (1970), Findakly (Glass Waveguides by Ion Exchange a Review; Optical Engineering 24:244-250 (1985); Roger F. Bartholomew, "Water in Glass," Treatise on Materials Science and Technology, Vol. 22, Glass III, eds. Minoru, Tomozawa et al., 75-128 (1982), Academic Press, or U.S. Pat. No. 3,912,481; etc.), CVD techniques (Thin Film Science and Technology, "Coatings on Glass," H. K. Tulker, Elsevier, 1984), thin-film coating techniques (Tulker, supra), silver-bismuth pool electric migration Electro-Float, Silver-bismuth, Pool Treatment, Vol. II, Glass Science and Technology, "Color Generation and Control in Glass," C. R. Bansford, Elsevier (1927)), ion-beam implantation (Tulker, supra), sol-gel techniques (Tulker, supra), diffusion from Ag-containing pastes (e.g., Kiefer, Glastechn. Ber. 46:325[8](1973)), etc. Other methods of activation can also be used such as that of U.S. Pat. No. 4,286,052.

The preferred method is the silver ion exchange which simultaneously hydrates a silicate glass.

However, processes can also be used where hydration (e.g. by acid treatment) and silver exchange are performed in separate steps in either order. It is also possible for base glasses to be manufactured with a silver content, then needing only hydration treatment for activation.

The silver ion exchange can be achieved by conventional acidic silver salt solution treatment. The well known technique is straightforwardly applicable to this invention in conjunction with routine optimization. Typically, suitable temperatures will be up to 374° C., as mentioned in the cited U.S. Pat. Nos., e.g., 200°-370° C., preferably, 300°-370° C. The pH of the silver salt acidic solution is generally less than 4 and preferably less than 2. Typically, the treatment will be conducted in a conventional autoclave using a pressure of at least 200 psig, more typically greater than 400 psig. The time of reaction (including time to heat up and cool down), as is well known, will depend on the desired depth of ion exchange and will typically be up to 16 hours, but more commonly approximately 2-3 hours. Other conditions can be operable or even preferred depending on the specific glass composition involved, the specific autoclave used, the specific solution employed, etc.

Typical ion-exchange solutions will include sufficient acid to achieve the necessary pH, preferably nitric acid, but also other strong mineral acids such as boric acid, hydrochloric acid, sulfuric acid, etc. Similarly, the precise silver salt utilized is not critical. Where halides are desired in the silver layer, silver halides, of course, can be employed. However, preferably the salt will be silver nitrate in accordance with the prior art. The concentration of the silver salt will typically be 90-95% of its solubility limit in the solution in order to enhance silver exchange but provide adequate safety against undesired precipitation. However, of course, much lower concentrations of silver are also applicable with correspondingly higher treatment times in order to achieve a given layer thickness.

The ion-exchange solution also classically contains salts of other cations which correspond to oxides contained in the base glass composition being treated in order to provide controllability of exchange. Most preferably, these other components will include alkali metal salts such as chlorides, but preferably the nitrates, e.g., preferably lithium nitrate since the alkali metal cations are quite mobile. Other employable salts include those of boron, alkaline earth metals, etc. Typically, these salts are included in the amounts discussed in the prior art, for example, 50-350 g/l. Also, typically included in these solutions is silica gel in amounts equal to or in excess of saturation and also halides, e.g., as a salt, a liquid or even as a gaseous additive.

Ion-exchange layer thicknesses achieved can be conventionally varied and are routinely selectable, e.g., by appropriate modification of solution composition and treatment time for a given composition. For the applications of this invention where high resolution images are desired, typically, relatively small layer thicknesses will be desired, for example, less than 10 $\mu$m, preferably less than 5 $\mu$m, more preferably less than 2 $\mu$m, and even lower. Also for considerations related to resolution, the ion-exchange layer thickness will preferably be selected to be smaller than depth of penetration of the writing beam, such as an electron beam. For example, 20 keV electron beams will typically penetrate silicate glasses to a depth of 3-5 $\mu$m. The ion-exchange layer thickness will thus be chosen to be less than this, e.g., typically about 75% less. However, of course, the precise thicknesses will not be critical in accordance with this invention where resolution is not as important, e.g., where the archival storage media are being used to write image (pattern) features significantly above the 1-10 $\mu$m level, e.g., for images used in conjunction with printed circuit boards or higher wavelength optical devices, gunsights, etc.

By "hydration content" herein is simply meant the compositional variations achieved in silicate compositions in accordance with the particular conventional hydration treatment utilized as discussed above. Typically, such treatments introduce into the silicate glass composition, $H^+$, $H_3O^+$, $H_2O$, silanol groups, etc.

The high-energy sensitive glass articles of this invention are preferably written by electron-beam irradiation, typically of 5 keV to 100 keV strength, the precise value not being critical and lower and higher values being applicable. Typically, the glass articles of this invention will have a sensitivity such that they can be stably darkened to provide an image having an optical density greater than 1.5 or 2 by only 2-6 scan counts of a 20 keV, 4000 na, 40 MHz rate, 1 micron spot, 0.3 micron address electron beam common in the industry, e.g., provided by a MEBES III system of Perkin Elmer. However, the media of this invention can also be written via other high-energy beams, such as X-ray radiation, or, where desired, with very high-energy UV radiation. The resultant images will be very accurately and stably readable using radiation to which the materials of this invention are not darkenable, e.g., UV radiation of a wavelength greater than about 360 nm or via visible radiation. The reading wavelength will not be critical as long as it satisfies the properties of the intended end-use and does not cause further significant "writing" of the glass article containing the written image.

The images achieved in accordance with this invention can be erasable, simply by heating the written glass articles to a temperature effective for erasure. Suitable temperatures for a given glass can be routinely determined by a few routine experiments. The images can also be erasable by instantaneous localized heating via a focused or directed heat supplying medium such as a laser or other energy source. Where the amplification effect of this invention is high, however, the written images may not be erasable by heating. Eraseability can be determined simply by a routine preliminary heating test at temperatures below the softening and/or strain points of the base glass and sensitive layer, typically at about 200° C. or lower, precise temperatures being routinely determinable.

A major advantage of this invention is that the images having adequate optical density for the intended end-use are also highly stable against all relevant ambient conditions encountered, e.g., in storage, shipping, use, etc.

In another application of the glass articles of this invention, they can be used for generation of relief images in their surfaces by conventional chemical and/or thermal treatments. A written image will render surfaces of the articles of this invention more or less susceptible to such treatments whereby selective etching can be achieved, e.g., by exposure of the entire bulk of the material to such treatments or of the entire surface of the material to such treatments or of only local sections of the material to the treatment, e.g., by reaction with chemical beams, ion beams, lasers, other focused or directed energy beams, etc. See, e.g., EP 0074157.

The preparation of the glasses of this invention can be achieved as follows: the required chemicals are selected and blended into a batch which is then melted in a fused silica, refractory or platinum crucible from 1100° C. to as high as 1650° C., or higher or lower temperatures, depending on the chosen composition and the crucible used. The glass is then refined at temperatures exceeding 1300° C. for periods typically from 2 to 4 hours, again depending on the glass composition and melt viscosity, with varied intervals of stirring. The glass is then typically cast into a steel mold and annealed at the transformation temperature plus about 20° to 30° C. for two hours, followed by cooling at 30° C./hour to room temperature. The resultant casting of glass can be cut and fabricated into thin plates for treatment by an ion-exchange procedure to activate the surface layer to electron beams. As usual, the compositions defined herein are batch compositions and do not include components present in the final compositions due to unavoidable contributions from the crucible to the melt, e.g., $SiO_2$ from a silica crucible, $ZrO_2$ from a refractory crucible, etc.

EXAMPLES 1-20

The examples in Table 1 illustrate the application of glass materials prepared in conformance with the invention of parent application Serial No. 07/369,997. The selected glass composition is first melted without the positive inclusion of any constituents which can lead to later spontaneous reduction of silver ions during the ion-exchange process to sensitize the active layer to electron beams. The preparation of these glasses proceeds in accordance with the above-described melting and forming procedures.

Polished glass plates of the examples are surface treated by silver ion exchange to activate the surface layer to electron beam irradiation using conditions within the preferred ranges above. The samples are electron beam irradiated on a JEOL 35c scanning electron microscope operating at 20 keV, with a beam current of 23.6 nA, focused onto a 100 micron spot with a 2-second exposure time. A typical resultant optical density is shown in FIG. 1, upper curves (for a glass with no OD agent). Following a short term increase in optical density at 436 nm, which reaches completion in less than 24 hours following electron beam exposure, there is no drop in optical density.

Figure 2:
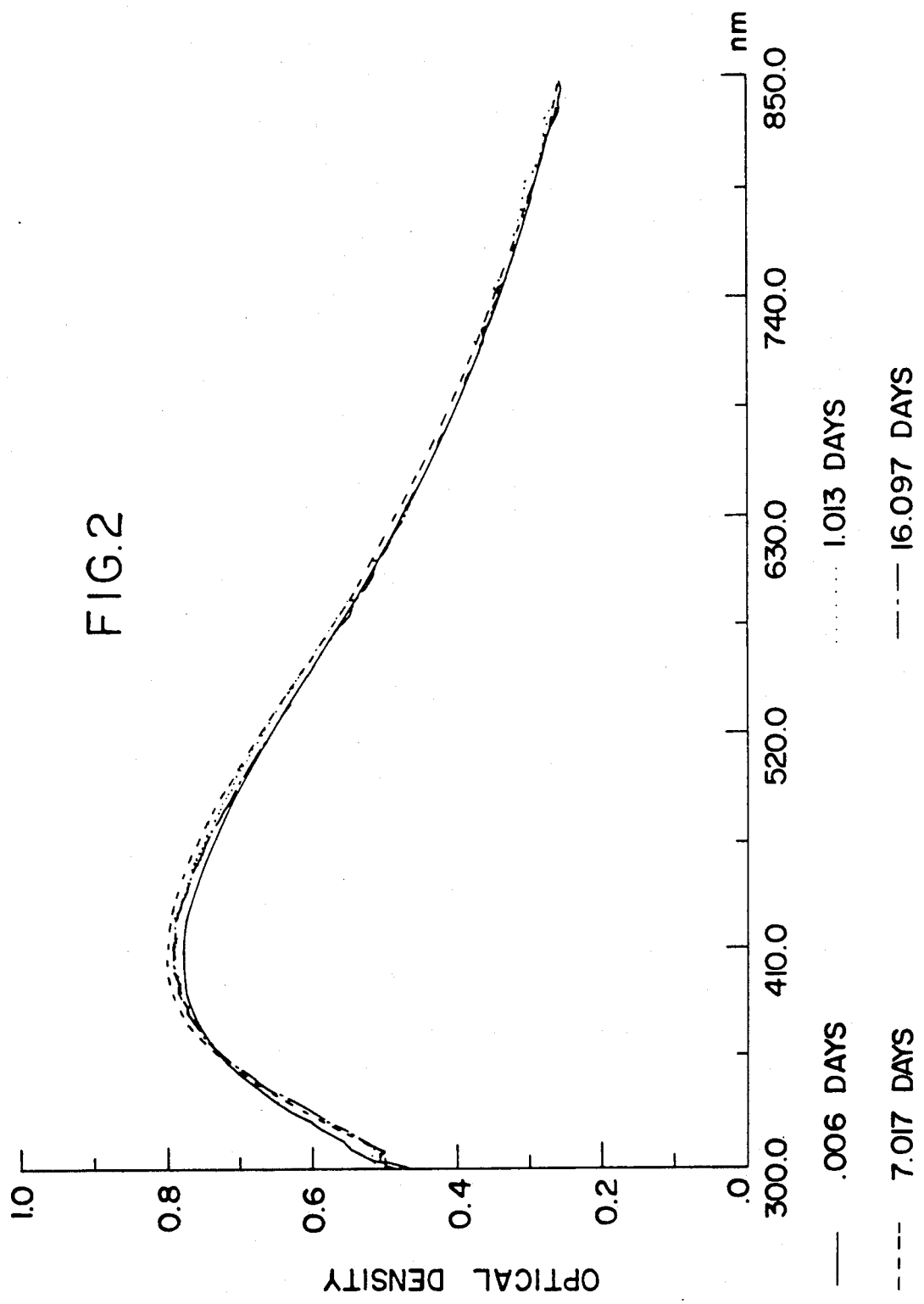

Polished glass plates of the examples are ion exchange surface treated at a higher temperature than those above and then electron beam irradiated under the same conditions. A typical resultant optical density is shown in FIG. 2 (for a glass with no OD agent). There is no evidence, within the measurement reproducibility of 0.03 OD in the UMSP-80 microdensitometer, for the short, less than 24 hour, relaxation of optical density to higher values exhibited in FIG. 1. In addition, no decrease was recorded for periods of time up to 10 days after electron beam exposure. The overall lower optical density exhibited by this sample is a result of an ion-exchange penetration depth, measured by analyzing interference in intensity from light reflected from the front face and the layer, of more than 5 microns. The penetration depth of the electron beam used for the irradiations is only 4.5 microns.

A composition is also melted and surface treated as described above (no OD agent) but contains a transition metal oxide containing 1 to 4 d-electrons in the atomic state, i.e., $TiO_2$. It exhibits a time instability of electron beam induced darkening in the material as shown in the lower curves of FIG. 1. Similar behavior of electron beam induced optical density instability with time occurs for samples containing other transition metal oxides which contain from 1 to 4 d-electrons in the atomic state. Surface treatment of these compositions at the higher temperature mentioned above fails to stabilize optical density.

EXAMPLES 21-43

Figure 3:
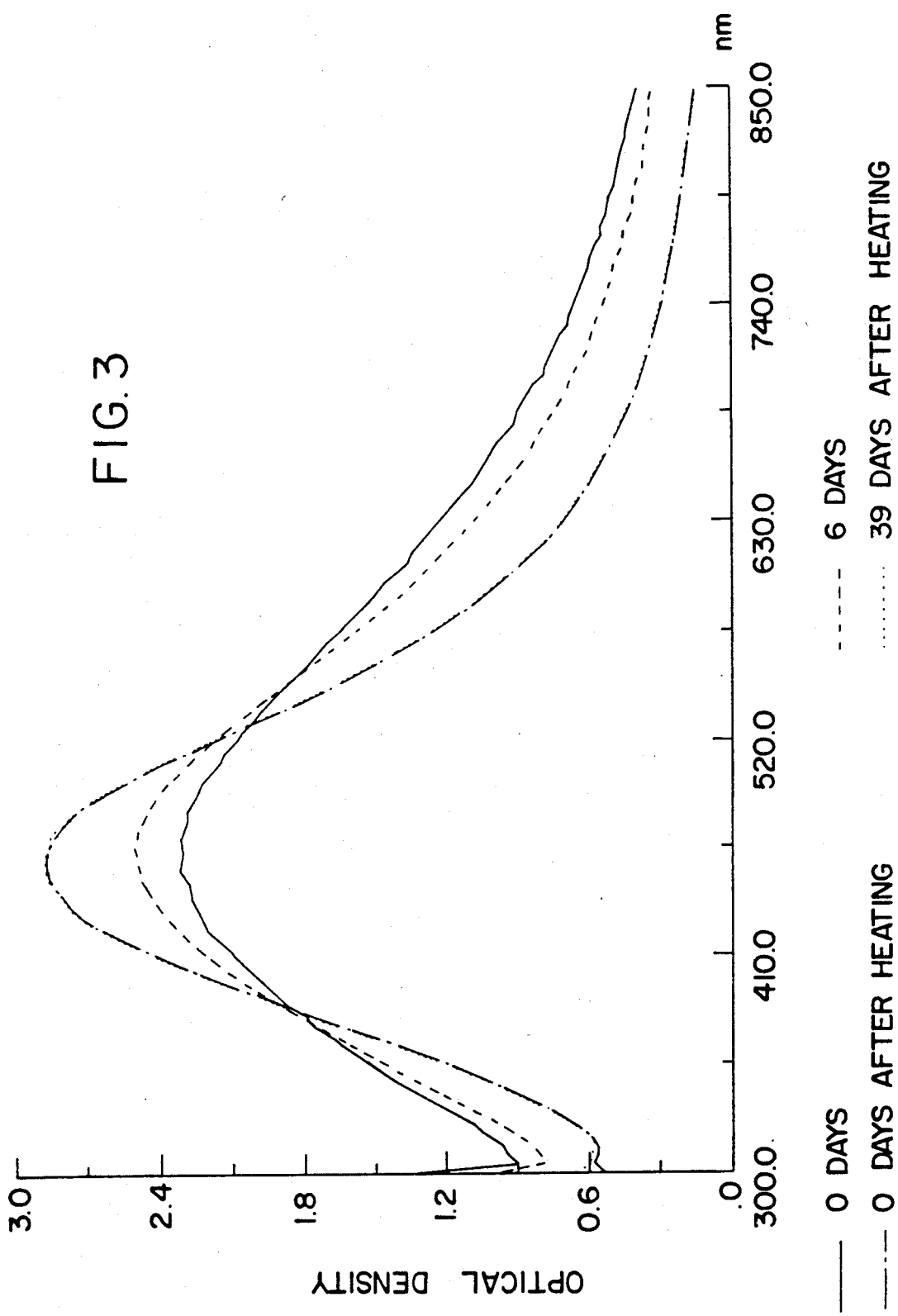

Using the same procedures, glasses are melted and tested containing OD agents. These are shown in Table 2 and are based on the composition of Example 9 as shown in the Tables below. For such glasses, a typical optical density curve is shown in FIG. 3 (OD agent is Mo). As above, there is observed a slight increase in OD during six days following e-beam irradiation. Following heat treatment at 100° C. for 24 hours, however, the OD amplification is accelerated, showing no further change with time at 436 nm. See also FIG. 9 which shows the OD spectrum of Examples 9 (no OD agents), 22 (As is OD agent) and 35 (Mo is OD agent).

EXAMPLES 44-72

Table 3 contains 29 examples in one of the preferred composition ranges.

The glass articles of these examples are manufactured as follows:

The raw materials (oxides, carbonates, nitrates, fluorides, chlorides, etc.) are weighed and thoroughly mixed. See Table 4. The mixture is melted at about 1400° C. to 1500° C., thereafter refined and well homogenized. Casting takes place at about 1300° C. into a preheated casting mold. After optical fine cooling, the glasses can be shaped as desired (e.g., a glass plate, or a similar item). Subsequently, a surface layer rich in Ag+ is produced by means of the processes described above.

Figure 4:
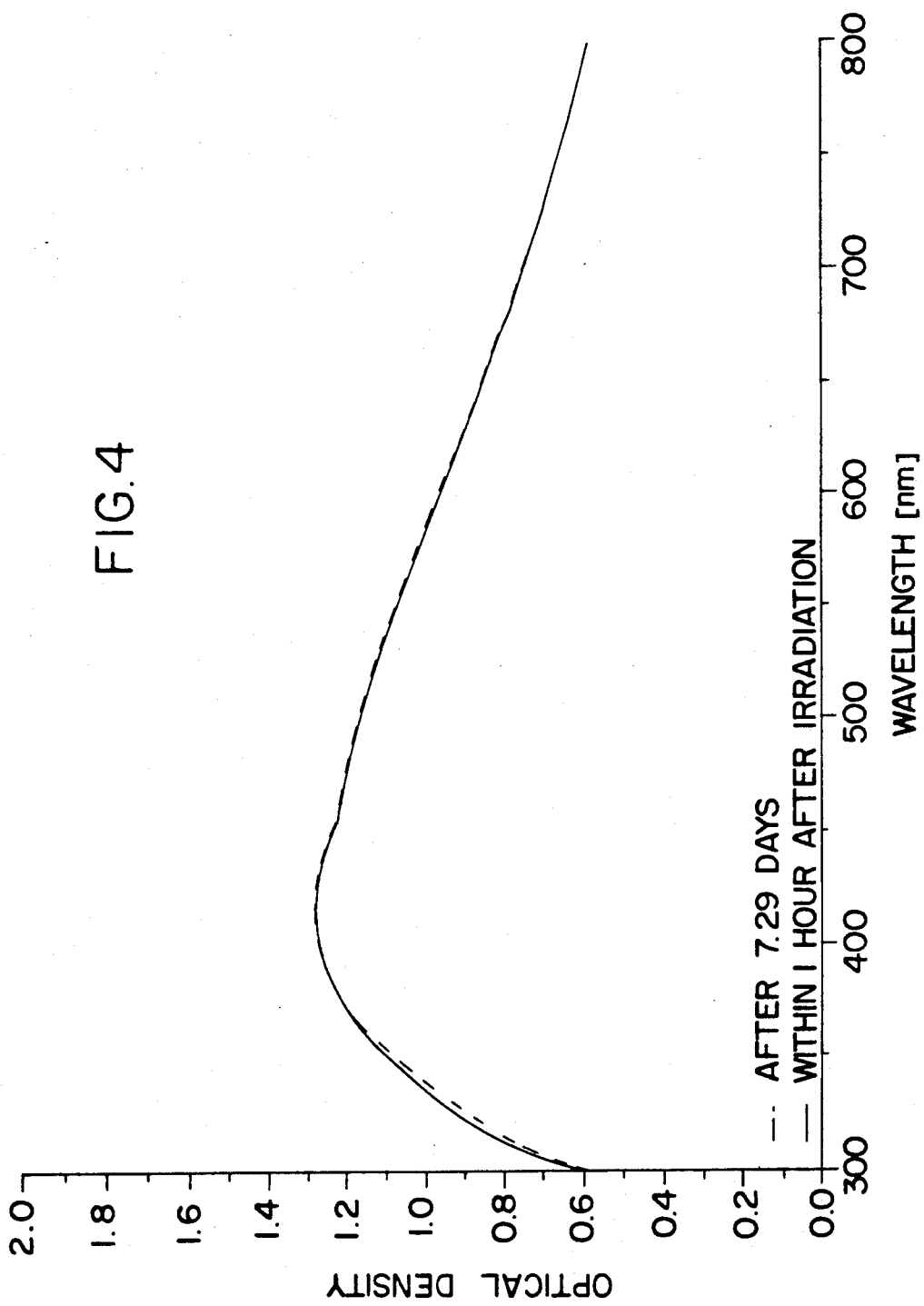
Figure 5:
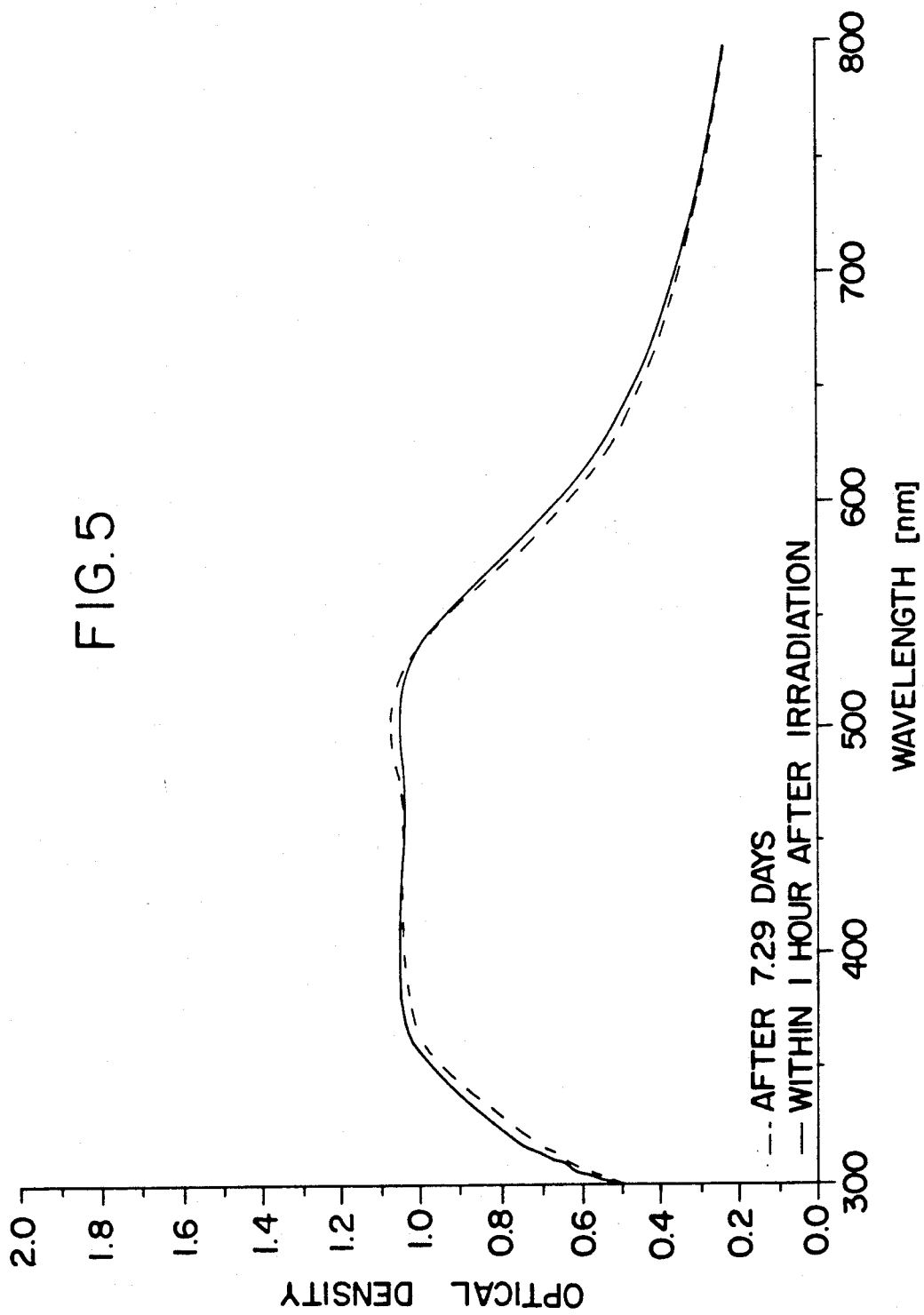

The time stability of this invention is illustrated in FIGS. 4 and 5 with glass articles having the composition set forth in Examples 63 and 72. The surface layer of the glass articles, sensitized to electron radiation, was darkened by means of an electron beam, and the optical density of the darkened layer was measured shortly after irradiation as well as 7,29 days after irradiation. The glass articles were not exposed to high energy radiation during the time after irradiation.

Figure 6:
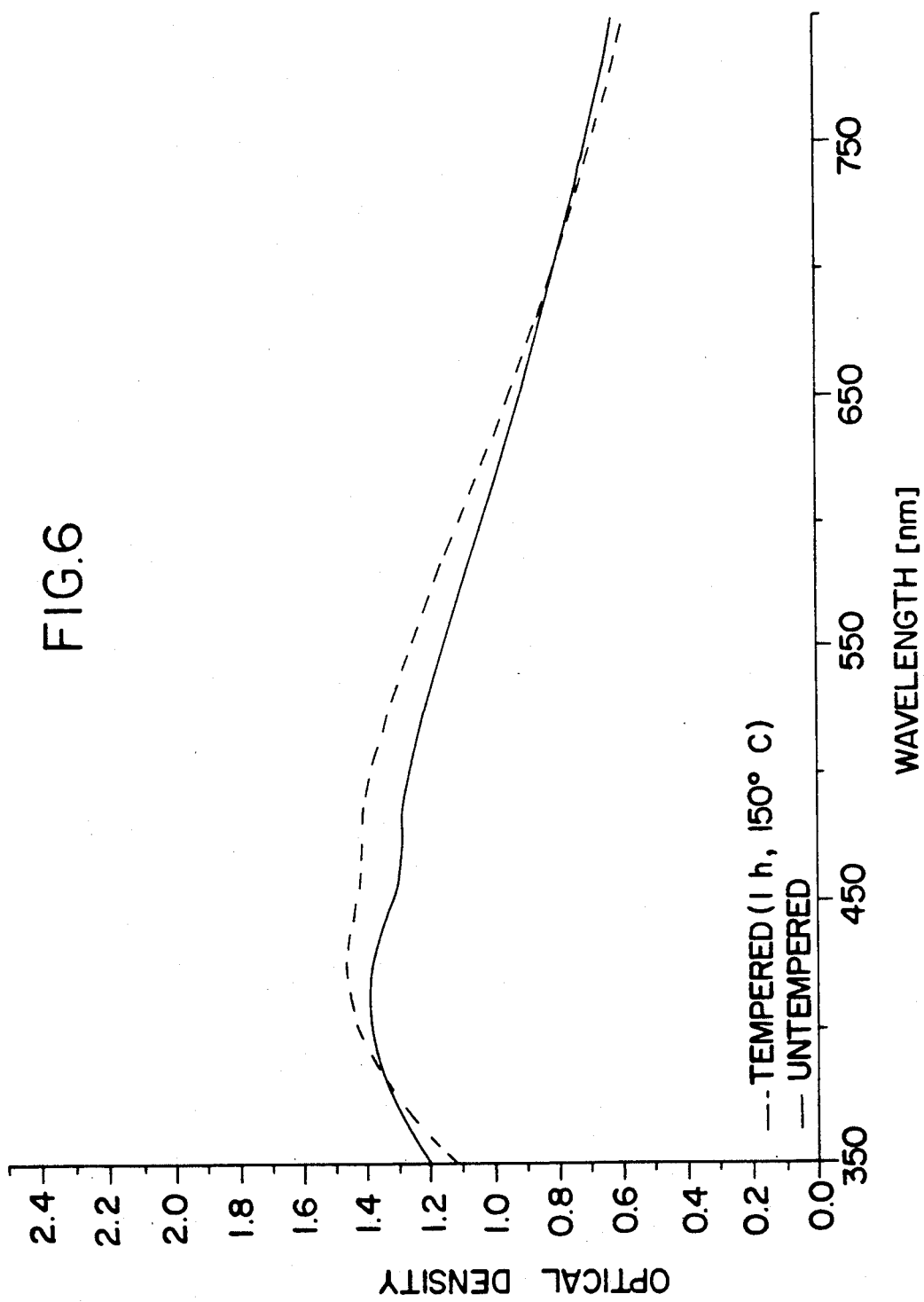
Figure 7:
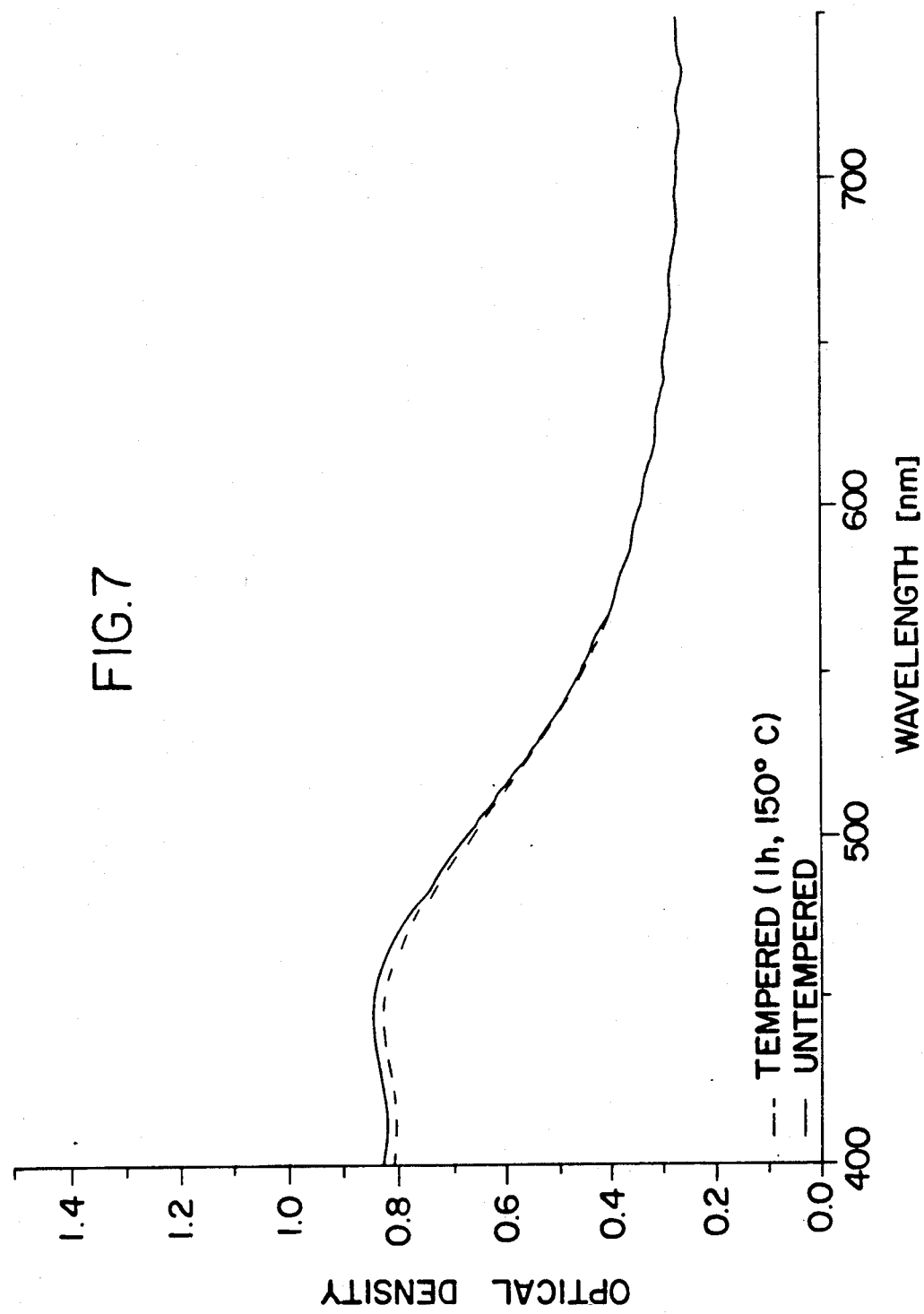

The thermal stability is illustrated in FIGS. 6 and 7 with the glass articles having the composition indicated in Examples 63 and 52. The glass articles were likewise treated according to the above-mentioned procedure, and the surface layers were darkened by means of an electron beam. After the first measurement of darkening, the glass articles were exposed to a temperature of 150° C. for one hour and then again measured. Although such specimens are not subjected to such a high temperature in use, this temperature yet was chosen in FIGS. 6 and 7 to be of such a high level in order to demonstrate the thermal stability of the produced patterns from these particular glasses.

Another feature of glass articles according to this invention is that the patterns produced in the surface layer possess no sensitivity to UV light. This is made clear in FIG. 8 wherein the darkened surface layer of a glass article was measured having a composition according to Example 63 prior to and after a UV radiation of a wavelength of 436 nm with a dose of 0.7 kI/cm$^2$. The glasses according to this invention thus show no solarization effects and can be exposed without misgivings to strong sunlight.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

TABLE 1

| Melt # | 1 | 2 | 3 | 4 | 5 | 6 | 7 | 8 | 9 | 10 | 11 |
|---|---|---|---|---|---|---|---|---|---|---|---|
| SiO$_2$ | 74 | 74 | 72 | 74 | 74 | 74 | 73 | 75.5 | 74 | 66 | 72 |
| B$_2$O$_3$ | 2 | 2 | 2 | 2 | 2 | 2 | 2 | — | 2 | 2 | 4 |
| Al$_2$O$_3$ | 1 | 1 | 1 | 1 | 1 | 1 | 1 | 1 | 1 | 1 | — |
| P$_2$O$_5$ | — | — | — | — | — | — | — | 0.5 | — | — | — |
| Li$_2$O | 4 | 4 | 4 | 4 | 4 | 4 | 4 | 4 | 6 | 5 | 4 |
| Na$_2$O | 8 | 8 | 8 | 8 | 8 | 8 | 8 | 8 | 7 | 10 | 8 |
| K$_2$O | 4 | 4 | 4 | 4 | 4 | 4 | 4 | 4 | 3 | 5 | 4 |
| Rb$_2$O | — | — | — | — | — | — | — | — | — | — | — |
| Cs$_2$O | — | — | — | — | — | — | — | — | — | — | — |
| Sum of Alkali | 16 | 16 | 16 | 16 | 16 | 16 | 16 | 16 | 16 | 20 | 16 |
| MgO | — | — | — | — | 7 | — | — | — | — | — | — |
| CaO | — | — | 2 | 7 | — | — | — | — | — | — | — |
| SrO | — | — | — | — | — | 7 | — | — | — | — | — |
| BaO | — | 7 | — | — | — | — | — | — | — | — | — |
| ZnO | 7 | — | 7 | — | — | — | 7 | 7 | 7 | 7 | 7 |
| PbO | — | — | — | — | — | — | 1 | — | — | — | — |
| Sum of Oxides | 100 | 100 | 100 | 100 | 100 | 100 | 100 | 100 | 100 | 96 | 99 |
| F | — | — | — | — | — | — | — | — | — | — | — |
| Cl | 3 | 3 | 3 | 3 | 3 | 3 | 3 | 3 | 3 | 3 | 3 |
| Br | — | — | — | — | — | — | — | — | — | — | — |
| I | — | — | — | — | — | — | — | — | — | — | — |
| Sum of Halogens | 3 | 3 | 3 | 3 | 3 | 3 | 3 | 3 | 3 | 3 | 3 |
| α(20-300° C.) × 10$^{-7}$ °C.$^{-1}$ | 88.0 | 97.4 | 87.5 | 88.5 | 82.8 | 95.4 | 89.9 | 85.6 | 81.8 | 102.6 | 87.2 |
| Tg (°C.) | 474 | 471 | 485 | 502 | 484 | 487 | 471 | 467 | 473 | 451 | 492 |
| nd | 1.5135 | 1.5271 | 1.5195 | 1.5152 | 5.5035 | 1.5185 | 1.5194 | 1.5059 | 1.5145 | 1.5216 | 1.5179 |
| vd | 60.0 | 60.2 | 59.9 | 60.4 | 61.9 | 60.1 | 55.9 | 60.0 | 60.0 | 58.8 | 60.7 |
| % T at 365 nm, 2 mm t | 90.8 | 89.4 | 90.3 | 91.6 | 92.0 | 90.5 | 91.6 | 91.9 | 91.7 | 91.5 | 90.4 |
| O.D. (435 nm) t = 0 days | 1.82 | 0.48 | 0.75 | 0.90 | 1.35 | 0.75 | 1.43 | 1.48 | 1.83 | 1.58 | 1.09 |
| O.D. (435 nm) t = 7 days | 1.83 | 0.48 | 0.76 | 0.91 | 1.15 | 0.77 | 1.46 | 1.46 | 1.82 | 1.58 | 1.08 |
| % T at 436 nm, 2 mm t | 91.7 | 91.3 | 91.5 | 91.8 | 92.1 | 91.6 | 91.7 | 92.0 | 91.8 | 91.6 | 91.6 |
| D.O.L. (μm) | 5.3 | 10.3 | 4.0 | 3.8 | 7.9 | 5.9 | 5.2 | 8.4 | 4.5 | 11.3 | 4.5 |

| Melt # | 12 | 13 | 14 | 15 | 16 | 17 | 18 | 19 | 20 |
|---|---|---|---|---|---|---|---|---|---|
| SiO$_2$ | 72 | 76 | 74 | 74 | 74 | 74 | 76 | 76 | 76 |

TABLE 1-continued

| | | | | | | | | | |
|---|---|---|---|---|---|---|---|---|---|
| $B_2O_3$ | — | — | — | 2 | 2 | 2 | 2 | 2 | 2 |
| $Al_2O_3$ | 4 | — | — | 1 | 1 | 1 | 1 | 1 | 1 |
| $P_2O_5$ | — | — | 1 | — | — | — | — | — | — |
| $Li_2O$ | 4 | 4 | 4 | 4 | 3 | 4 | — | 6 | — |
| $Na_2O$ | 8 | 8 | 8 | 8 | 6 | 8 | 12 | 6 | 8 |
| $K_2O$ | 4 | 4 | 4 | 4 | 3 | — | — | — | 4 |
| $Rb_2O$ | — | — | — | — | — | — | — | — | — |
| $Cs_2O$ | — | — | — | — | — | — | — | — | — |
| Sum of Alkali | 16 | 16 | 16 | 16 | 12 | 12 | 12 | 12 | 12 |
| MgO | — | — | — | — | — | — | — | — | — |
| CaO | — | — | — | — | — | — | — | — | — |
| SrO | — | — | — | — | — | — | — | — | — |
| BaO | — | — | — | — | — | — | — | — | — |
| ZnO | 7 | 7 | 11 | 7 | 11 | 11 | 9 | 9 | 9 |
| PbO | — | — | — | — | — | — | — | — | — |
| Sum of Oxides | 99 | 99 | 102 | 100 | 100 | 100 | 100 | 100 | 100 |
| F | — | — | — | — | — | — | — | — | — |
| Cl | 3 | 3 | 3 | — | 3 | 3 | 3 | 3 | 3 |
| Br | — | — | — | — | — | — | — | — | — |
| I | — | — | — | — | — | — | — | — | — |
| Sum of Halogens | 3 | 3 | 3 | 0 | 3 | 3 | 3 | 3 | 3 |
| $\alpha(20\text{-}300°C.) \times 10^{-7} °C.^{-1}$ | 78.9 | 87.1 | 94.6 | 86.3 | 66.7 | 62.3 | 67.6 | 64.0 | 70.4 |
| Tg (°C.) | 485 | 478 | 459 | 488 | 508 | 498 | 568 | 470 | 569 |
| nd | 1.5111 | 1.5167 | 1.5143 | 1.5149 | 1.5155 | 1.5162 | 1.5076 | 1.5114 | 1.5135 |
| vd | 59.6 | 59.2 | 59.0 | — | — | — | 59.2 | 60.1 | — |
| % T at 365 nm, 2 mm t | 91.8 | 90.7 | 91.7 | 90.8 | 91.5 | 91.6 | 91.8 | 90.4 | 90.2 |
| O.D. (435 nm) t = 0 days | 2.24 | 0.40 | 0.91 | 1.32 | 0.79 | 1.17 | 1.66 | 1.09 | 0.83 |
| O.D. (435 nm) t = 7 days | 1.96 | 0.38 | 0.90 | 1.30 | 0.76 | 1.09 | 1.58 | 1.08 | 0.75 |
| % T at 436 nm, 2 mm t | 91.9 | 91.6 | 91.8 | 91.7 | 91.8 | 91.8 | 91.9 | 91.6 | 90.9 |
| D.O.L. (μm) | 4.5 | 5.6 | 5.5 | 5.4 | 1.5 | 1.4 | 2.4 | 1.8 | 2.2 |

Alpha (20-300 C.) · $10^{-7}$ °C$^{-1}$ is the coefficient of thermal expansion
Tg (°C.) is the transformation temperature of each glass
nd is the refractive index at the He d-line of 587.6 nm.
vd is the dispersion value for the glass
% T 365 nm, 2 mm t is the transmission value at that wavelength through a sample 2 mm thick
O.D. (435 nm) t = 0 days is the optical density measured on a UMSP microdensitometer at around t = 0.004 to 0.012 days from irradiation
O.D. (435) t = 7 days is the same value recorded 7 days later, within a few hours
% T at 436 nm, 2 mm t is the transmission value at 436 nm. OD values are collected at 435 nm as a matter of convenience; and they are, in general, not too different from the OD value 1 nm away at 436 nm. The transmission values are "external" transmissions and thus are lower by the amount of incident light lost through reflection at the sample surfaces as well as by internal scatter and absorption
D.O.L. (μm) is the depth of active layer for each sample following the surface treatment procedure. The measurement is in microns.

TABLE 2

Properties of Glasses with OD Agent Additions to Example 9 Composition*

| | 21 | 22 | 23 | 24 | 25 | 26 | 27 | 28 | 29 | 30 | 31 | 32 |
|---|---|---|---|---|---|---|---|---|---|---|---|---|
| OD Agent | $Sb_2O_3$ | $As_2O_3$ | $Bi_2O_3$ | $CeO_2$ | $Cr_2O_3$ | CoO | CuO | $Eu_2O_3$ | $Ga_2O_3$ | $GeO_2$ | $In_2O_3$ | FeO |
| Wt. % Added+ | 0.2 | 0.2 | 0.5 | 0.2 | 0.5 | 0.1 | 0.5 | 1.0 | 1.0 | 1.0 | 1.0 | 0.5 |
| $\alpha(20\text{-}300°C.) \times 10^{-7} °C.^{-1}$ | | 81.3 | 80.7 | | | | | | 77.2 | 79.1 | 80.5 | |
| $T_g$ (°C.) | | 471 | 464 | | | | | | 471 | 466 | 473 | |
| $n_d$ | | 1.5144 | | | | 1.5144 | | 1.5158 | 1.5182 | 1.5155 | 1.5159 | |
| $V_d$ | | | | | | | | | | | | |
| % T at 365 nm, 2 mm t | | 91.9 | | | | | | 89.9 | 91.4 | 91.7 | 91.8 | |
| O.D. (435 nm) t = 0 days | | | | | | 1.97 | | | 1.99 | | | |
| O.D. (435 nm) t = 7 days | | | | | | 2.05 | | | 1.94 | | | |
| % T at 436 nm, 2 mm t | | 91.9 | | | | | | 91.8 | 91.6 | 91.8 | 91.8 | |
| D.O.L. (m) | | | | | | 4.8 | | | 4.0 | | | |

| | 33 | 34 | 35 | 36 | 37 | 38 | 39 | 40 | 41 | 42 | 43 |
|---|---|---|---|---|---|---|---|---|---|---|---|
| OD Agent | PbO | $MnO_2$ | $MoO_3$ | NiO | $Pr_2O_3$ | $SeO_2$ | $Sm_2O_3$ | $TeO_2$ | $Tb_2O_3$ | $SnO_2$ | $Yb_2O_5$ |
| Wt. % Added+ | 1 | 0.5 | 1.0 | 0.5 | 1.0 | 1.0 | 1.0 | 1.0 | 1.0 | 0.5 | 1.0 |
| $\alpha(20\text{-}300°C.) \times 10^{-7} °C.^{-1}$ | | | 78.5 | 81.0 | | | 80.9 | 80.1 | | | |
| Tg (°C.) | | | 469 | 465 | | | 471 | 464 | | | |
| $n_d$ | | | 1.5195 | 1.5189 | | | 1.5159 | 1.5158 | | | |

TABLE 2-continued

Properties of Glasses with OD Agent Additions to Example 9 Composition*

| $V_d$ | | | | |
|---|---|---|---|---|
| % T at 365 nm, 2 mm t | 86.4 | 87.9 | 90.2 | 76.6 |
| O.D. (435 nm) t = 0 days | 2.42 | 1.93 | | |
| O.D. (435 nm) t = 7 days | 2.46 | 1.82 | | |
| % T at 436 nm, 2 mm t | 90.6 | | 91.5 | 80.9 |
| D.O.L. (m) | 4.3 | 4.5 | | |

* based on total weight of all other components of Example 9
*Example 9 in wt % see next page

EXAMPLE 9

| Oxide | Mole % | Weight % |
|---|---|---|
| $SiO_2$ | 74 | 72.26 |
| $B_2O_3$ | 2 | 2.26 |
| $Al_2O_3$ | 1 | 1.65 |
| $Li_2O$ | 6 | 2.92 |
| $Na_2O$ | 7 | 7.06 |
| $K_2O$ | 3 | 4.59 |
| ZnO | 7 | 9.27 |
| Cl | 3 | 1.73 |
| Sum of Oxides | 100 | 100.01 |
| Sum of Alkali | 16 | 14.57 |
| Sum of Halides | 3 | 1.73 |

TABLE 3

Examples in Weight Percent

| | 44 | 45 | 46 | 47 | 48 | 49 | 50 | 51 | 52 | 53 | 54 | 55 | 56 | 57 | 58 | 59 |
|---|---|---|---|---|---|---|---|---|---|---|---|---|---|---|---|---|
| $SiO_2$ | 69.9 | 70.39 | 68.9 | 69.38 | 67.9 | 68.37 | 67.3 | 67.77 | 66.3 | 66.76 | 69.9 | 70.39 | 69.4 | 68.4 | 71.0 | 71.0 |
| $B_2O_3$ | 2.5 | 2.51 | 2.5 | 2.51 | 2.5 | 2.51 | 2.5 | 2.51 | 2.5 | 2.51 | 2.5 | 2.51 | 2.1 | 2.1 | 14.1 | 14.1 |
| $Al_2O_3$ | 1.7 | 1.71 | 1.7 | 1.71 | 1.7 | 1.71 | 1.7 | 1.71 | 1.7 | 1.71 | 1.7 | 1.71 | 1.2 | 1.2 | 2.2 | 2.2 |
| $Na_2O$ | 6.7 | 6.74 | 6.7 | 6.74 | 6.7 | 6.74 | 6.7 | 6.74 | 6.7 | 6.74 | 6.7 | 6.74 | 6.2 | 6.2 | 4.2 | 4.2 |
| $K_2O$ | 5.3 | 5.33 | 5.3 | 5.33 | 5.3 | 5.33 | 5.3 | 5.33 | 5.3 | 5.33 | 5.3 | 5.33 | 5.1 | 5.1 | 1.1 | 1.1 |
| $Li_2O$ | 2.0 | 2.01 | 2.0 | 2.01 | 2.0 | 2.01 | 2.0 | 2.01 | 2.0 | 2.01 | 2.0 | 2.01 | 2.0 | 2.0 | 0.3 | 0.3 |
| ZnO | 10.3 | 10.37 | 10.3 | 10.37 | 10.3 | 10.37 | 10.3 | 10.37 | 10.3 | 10.37 | 10.3 | 10.37 | 10.3 | 10.0 | — | — |
| CaO | — | — | — | — | — | — | — | — | — | — | — | — | — | — | — | — |
| BaO | — | — | — | — | — | — | — | — | — | — | — | — | — | — | — | — |
| PbO | — | — | — | — | — | — | — | — | — | — | — | — | — | — | 7.1 | 6.1 |
| $SnO_2$ | 0.9 | 0.9 | 1.9 | 1.91 | 2.9 | 2.92 | 3.5 | 3.52 | 4.5 | 4.53 | — | — | — | — | — | — |
| $TiO_2$ | — | — | — | — | — | — | — | — | — | — | — | — | — | — | — | — |
| $ZrO_2$ | 0.7 | — | 0.7 | — | 0.7 | — | 0.7 | — | 0.7 | — | 0.7 | — | 0.7 | 0.7 | — | — |
| $CeO_2$ | — | — | — | — | — | — | — | — | — | — | 0.9 | 0.9 | 3.0 | 4.3 | — | 1.0 |
| $Bi_2O_3$ | — | — | — | — | — | — | — | — | — | — | — | — | — | — | — | — |
| $As_2O_3$ | — | — | — | — | — | — | — | — | — | — | — | — | — | — | — | — |
| Cl | 1.6 | 1.6 | 1.6 | 1.6 | 1.6 | 1.6 | 1.6 | 1.6 | 1.6 | 1.6 | 1.6 | — | 1.6 | 1.6 | 1.2 | — |
| F | — | — | — | — | — | — | — | — | — | — | — | — | — | — | — | — |
| $NO_3 + NO_2$ | — | — | — | 0.3 | — | — | — | — | — | — | — | — | — | — | — | — |
| $OD_{436\ nm}$* | 1.53 | | | | 1.74 | | 0.99 | | 1.09 | | | | | | 1.41 | 1.61 |

| | 60 | 61 | 62 | 63 | 64 | 65 | 66 | 67 | 68 | 69 | 70 | 71 | 72 |
|---|---|---|---|---|---|---|---|---|---|---|---|---|---|
| $SiO_2$ | 69.5 | 71.0 | 64.0 | 70.0 | 70.0 | 69.44 | 62.8 | 67.71 | 69.73 | 66.34 | 68.15 | 64.0 | 66.9 |
| $B_2O_3$ | 14.1 | 14.1 | 2.1 | 11.6 | 11.6 | 16.81 | 10.2 | 11.19 | 14.71 | 14.27 | 13.8 | 14.2 | 2.1 |
| $Al_2O_3$ | 2.2 | 2.2 | 1.2 | — | — | 2.99 | — | — | 1.34 | 1.42 | — | — | 1.2 |
| $Na_2O$ | 4.2 | 4.2 | 6.2 | 9.5 | 9.5 | 8.78 | 10.7 | 9.39 | 1.32 | — | 8.5 | 8.2 | 6.2 |
| $K_2O$ | 1.1 | 1.1 | 5.1 | 7.3 | 7.3 | 1.59 | 5.3 | 7.3 | 11.64 | 14.93 | 8.2 | 8.4 | 5.1 |
| $Li_2O$ | 0.3 | 0.3 | 1.9 | — | — | — | — | — | — | — | — | — | 1.9 |
| ZnO | — | — | 9.5 | — | — | — | 0.6 | — | 0.2 | 0.32 | — | — | 9.5 |
| CaO | — | — | — | 0.2 | 0.2 | — | — | 0.2 | 0.2 | — | — | — | — |
| BaO | — | — | — | 1.0 | 1.0 | — | 9.9 | 3.55 | 0.2 | 1.74 | 1.0 | 4.9 | — |
| PbO | 6.1 | — | 7.3 | — | — | — | — | — | — | — | — | — | 7.3 |
| $SnO_2$ | — | — | 2.9 | — | — | — | — | — | — | — | — | — | — |
| $TiO_2$ | — | — | — | 0.2 | — | — | 0.2 | 0.2 | 0.2 | — | 0.15 | 0.1 | — |
| $ZrO_2$ | — | — | — | — | — | — | — | — | — | — | — | — | — |
| $CeO_2$ | 2.5 | 1.0 | — | — | — | — | — | — | — | — | — | — | — |
| $Bi_2O_3$ | — | 6.1 | — | — | — | — | — | — | — | — | — | — | — |
| $As_2O_3$ | — | — | — | 0.05 | 0.05 | 0.35 | 0.3 | 0.3 | 0.3 | 0.33 | 0.2 | 0.2 | — |
| Cl | — | — | — | 0.4 | 0.45 | — | — | 0.2 | — | — | — | — | 1.4 |
| F | — | — | — | — | — | 0.07 | — | — | 0.97 | 0.8 | — | — | — |
| $NO_3 + NO_2$ | — | — | — | — | — | 0.7 | — | — | — | — | — | — | 0.3 |
| $OD_{436\ nm}$* | 1.25 | 1.47 | 1.26 | | | | | | | | | | 1.05 |

*O.D. at 436 mm following electron beam irradiation of samples.

TABLE 4

Example of a Melt Calculated for 100 kg of Glass*

| Oxide | % by Weight | Raw Material | Weighed Amount (kg) |
|---|---|---|---|
| $SiO_2$ | 64.00 | Sipur | 57.55 |
| $B_2O_3$ | 2.10 | $B_2O_3$ | 1.93 |
| $Al_2O_3$ | 1.20 | $Al(OH)_3$ | 1.65 |
| $Li_2O$ | 1.90 | $Li_2CO_3$ | 4.25 |

TABLE 4-continued

Example of a Melt Calculated for 100 kg of Glass*

| Oxide | % by Weight | Raw Material | Weighed Amount (kg) |
|---|---|---|---|
| Na₂O | 4.50 | Na₂CO₃ | 6.92 |
| Na₂O | 0.30 | NaNO₃ | 0.74 |
| Na₂O | 1.40 | NaCl | 2.37 |
| ZnO | 9.50 | ZnO | 8.55 |
| K₂O | 5.10 | K₂CO₃ | 6.73 |
| PbO | 7.30 | Pb₃O₄ | 6.71 |
| SnO₂ | 2.90 | SnO₂ | 2.60 |
|  |  | Σ | 100.00 |

*The properties of this glass are indicated in Table 3, Example 62.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

What is claimed is:

1. A method of forming an image readable by UV radiation comprising writing said image in a silicate glass article by electron beam irradiation thereof, the glass article being one of the following silicate glass composition in mole %:

| | |
|---|---|
| SiO₂ | 30-95 |
| P₂O₅ | 0-20 |
| B₂O₃ | 0-30 |
| Al₂O₃ | 0-40 |
| RO | 0-40 |
| R₂O | 1-35 |
| OD agent | 0.01-10 |
| halide | 0-10 | and essentially no transition metals having 1-4 d-electrons in the atomic state, wherein
RO is MgO, CaO, SrO, BaO, ZnO and/or PbO,
R₂O is Li₂O, Na₂O, K₂O, Rb₂O and/or Cs₂O,
halide is Cl, F, Br and/or I,
OD agent is one or more metals which do not possess 1-4 d-electrons in the atomic state and which can have at least two stable oxidation states other than the atomic state in silicate glasses,
at least one surface of said article having a substantially continuous silver and hydration content over its area, effective to render said surface darkenable upon exposure to electron beam radiation but substantially not thermoplastic,
said article being capable of being substantially darkened by electron beam irradiation over at least a portion of at least one surface thereof,
and said article having gemetric characteristics suitable for functioning as either a photomask reticle or an archival storage medium.

2. A method of claim 1, the silicate glass article having the following composition in mole %:

| | |
|---|---|
| SiO₂ | 40-90 |
| P₂O₅ | 0-5 |
| B₂O₃ | 0-30 |
| Al₂O₃ | 0-15 |
| RO | 5-30 |
| ΣLi₂O, Na₂O, K₂O | 5-25 |
| OD agent | 0.1-10 |
| halide | 0-6 |

3. A method of claim 1, the silicate glass article having the following composition in mole %:

| | |
|---|---|
| SiO₂ | 50-85 |
| P₂O₅ | 0-2 |
| B₂O₃ | 0-20 |
| Al₂O₃ | 0-5 |
| RO | 5-20 |
| ΣLi₂O, Na₂O, K₂O | 5-25 |
| OD agent | 0.5-5 |
| halide | 0.1-6 |

4. A method of claim 1, wherein OD agent is Mo.

5. A method of claim 1, wherein OD agent is As.

6. A method of claim 1, the silicate glass article comprising a bulk portion of said composition substantially devoid of silver and hydration content and a surface layer of said composition having said substantially continuous silver and hydration content.

7. A method of claim 6, wherein said bulk portion and said layer are monolithic.

8. A method of claim 1, the silicate glass article having said silver and hydration content substantially throughout its entirety.

9. A method of claim 1, the silicate glass article being a photomask reticle.

10. A method of claim 1, the silicate glass article being an optical disk.

11. A method of claim 1, the silicate glass article being an archival storage medium.

12. A method of claim 1, the silicate glass article being a substantially flat plate.

13. A method of claim 1, the silicate glass article being stably darkened to an optical density at 436 nm greater than 1.5 by 2-6 scan counts of a 20 keV, 4000 na, 40 MHz rate, 1 micron spot, 0.5 micron address electron beam.

14. A method of claim 1, wherein said silver content is achieved by ion exchange of said glass composition with an acidic solution of a silver salt at a temperature of 200°-370° C. or higher, a pressure greater than 200 psig and for a treatment time greater than 30 seconds.

15. A method of claim 14, wherein the concentration of the silver salt in the solution is about 90-95% of its solubility limit.

16. A method of claim 1, wherein said E-beam darkened portion forms an image readable with actinic radiation.

17. A method of claim 1, wherein OD agent is Sn.

18. A method of forming an image readable by UV radiation comprising writing said image in a silicate glass article by electron beam irradiation thereof, the glass article being one of the following silicate glass composition in mole %:

| | |
|---|---|
| SiO₂ | 30-95 |
| P₂O₅ | 0-20 |
| B₂O₃ | 0-30 |
| Al₂O₃ | 0-40 |
| RO | 0-40 |
| R₂O | 1-35 |
| OD agent | 0.01-10 |
| halide | 0-10 | and an amount of transition metals having 1-4 d-electrons in the atomic state which is ineffective to substantially affect the photosensitivity properties of the glass article, wherein RO is MgO, CaO, SrO, BaO, ZnO and/or PbO,
R₂O is Li₂O, Na₂O, K₂O, Rb₂O and/or Cs₂O,
halide is Cl, F, Br and/or I,
OD agent is one or more metals which do not possess 1-4 d-electrons in the atomic state and which can have at least two stable oxidation states other than the atomic state in silicate glasses,
at least one surface of said article having a substantially continuous silver and hydration content over its area, effective to render said surface darkenable upon exposure to electron beam radiation but substantially not thermoplastic,
said article being capable of being substantially darkened by electron beam irradiation over at least a portion of at least one surface thereof,
and said article having geometric characteristics suitable for functioning as either a photomask reticle or an archival storage medium.

19. A method of claim 18, wherein the amount of 1-4 d-electrons transition metal is 0.01-0.4 mole %.

20. A method of claim 18, wherein said transition metal having 1-4 d-electrons in the atomic state is Zr, Ti, W or Nb.

21. A method of forming an image readable by UV radiation comprising writing said image in a silicate glass article by electron beam irradiation thereof, the glass article being one of the following silicate glass composition in mole %:

| | |
|---|---|
| SiO₂ | 30-95 |
| P₂O₅ | 0-20 |
| B₂O₃ | 0-30 |
| Al₂O₃ | 0-40 |
| RO | 0-40 |
| R₂O | 1-35 |
| OD agent | 0.01-10 |
| halide | 0-10 | and 0.5 to 15 mole% of a transition metal having 1-4 d-electrons in the atomic state, wherein RO is MgO, CaO, SrO, BaO, ZnO and/or PbO,
R₂O is Li₂O, Na₂O, K₂O, Rb₂O and/or Cs₂O,
halide is Cl, F, Br and/or I,
OD agent is one or more metals which do not possess 1-4 d-electrons in the atomic state and which can have at least two stable oxidation states other than the atomic state in silicate glasses,
at least one surface of said article having a substantially continuous silver and hydration content over its area, effective to render said surface darkenable upon exposure to electron beam radiation but substantially not thermoplastic,
said article being capable of being substantially darkened by electron beam irradiation over at least a portion of at least one surface thereof,
and said article having geometric characteristics suitable for functioning as either a photomask reticle or an archival storage medium
with the proviso that the OD metal is not Cu or Ce.

22. A method of claim 21, wherein said transition metal having 1-4 d-electrons in the atomic state is Zr, Ti, W or Nb.

23. A method of forming an image readable by UV radiation comprising writing said image in a silicate glass article by electron beam irradiation thereof, the glass article being one of the following silicate glass compositions in mole %

| | |
|---|---|
| SiO₂ | 30-95 |
| P₂O₅ | 0-20 |
| B₂O₃ | 0-30 |
| Al₂O₃ | 0-40 |
| RO | 0-40 |
| R₂O | 1-35 |
| OD agent | 0.01-10 |
| halide | 0-10 | and essentially no transition metals having 1-4 d-electrons in the atomic state, wherein RO is MgO, CaO, SrO, BaO, ZnO and/or PbO,
R₂O is Li₂O, Na₂O, K₂O, Rb₂O and/or Cs₂O,
halide is Cl, F, Br and/or I.
OD agent is one or more metals which do not possess 1-4 d-electrons in the atomic state and which can have at least two stable oxidation states other than the atomic state in silicate glasses,
at least one surface of said article having a substantially continuous silver and hydration content over its area, effective to render said surface darkenable upon exposure to electron beam radiation but substantially not thermoplastic,
said article substantially not exhibiting alterable photo-anisotropic effects inducible by actinic UV radiation,
and said article having geometric characteristics suitable for functioning as either a photomask reticle or an archival storage medium.

24. A method of forming an image readable by UV radiation comprising writing said image in a silicate glass article by electron beam irradiation thereof, the glass article being one of the following silicate glass compositions in mole %

| | |
|---|---|
| SiO₂ | 30-95 |
| P₂O₅ | 0-20 |
| B₂O₃ | 0-30 |
| Al₂O₃ | 0-40 |
| RO | 0-40 |
| R₂O | 1-35 |
| OD agent | 0.01-10 |
| halide | 0-10 | and an amount of transition metals having 1-4 d-electrons in the atomic state which is ineffective to substantially affect the photosensitivity properties of the glass article, wherein RO is MgO, CaO, SrO, BaO, ZnO and/or PbO,
R₂O is Li₂O, Na₂O, K₂O, Rb₂O and/or Cs₂O,
halide is Cl, F, Br and/or I,
OD agent is one or more metals which do not possess 1-4 d-electrons in the atomic state and which can have at least two stable oxidation states other than the atomic state in silicate glasses,
at least one surface of said article having a substantially continuous silver and hydration content over its area, effective to render said surface darkenable upon exposure to electron beam radiation but substantially not thermoplastic,
said article substantially not exhibiting alterable photo-anisotropic effects inducible by actinic UV radiation, and said article having geometric characteristics suitable for functioning as either a photomask reticle or an archival storage medium.

25. A method of claim 24, wherein the amount of 1-4 d-electrons transition metal is 0.01-0.4 mole %.

26. A method of claim 24, wherein said transition metal having 1-4 d-electrons in the atomic state is Zr, Ti, W or Nb.

27. A method of forming an image readable by UV radiation comprising writing said image in a silicate glass article by electron beam irradiation thereof, the glass article being one of the following silicate glass compositions in mole %

| | |
|---|---|
| $SiO_2$ | 30-95 |
| $P_2O_5$ | 0-20 |
| $B_2O_3$ | 0-30 |
| $Al_2O_3$ | 0-40 |
| RO | 0-40 |
| $R_2O$ | 1-35 |
| OD agent | 0.01-10 |
| halide | 0-10 | and 0.5 to 15 mole % of a transition metal having 1-4 d-electrons in the atomic state, wherein RO is MgO, CaO, SrO, BaO, ZnO and/or PbO,
$R_2O$ is $Li_2O$, $Na_2O$, $K_2O$, $Rb_2O$ and/or $Cs_2O$,
halide is Cl, F, Br and/or I,
OD agent is one or more metals which do not possess 1-4 d-electrons in the atomic state and which can have at least two stable oxidation states other than the atomic state in silicate glasses,
at least one surface of said article having a substantially continuous silver and hydration content over its area, effective to render said surface darkenable upon exposure to electron beam radiation but substantially not thermoplastic,
said article substantially not exhibiting alterable photo-anisotropic effects inducible by actinic UV radiation,
and said article having geometric characteristics suitable for functioning as either a photomask reticle or an archival storage medium,
with the proviso that the OD metal is not Cu or Ce.

28. A method of erasing the electron-beam darkening of the silicate glass article of the following silicate glass composition in mole %:

| | |
|---|---|
| $SiO_2$ | 30-95 |
| $P_2O_5$ | 0-20 |
| $B_2O_3$ | 0-30 |
| $Al_2O_3$ | 0-40 |
| RO | 0-40 |
| $R_2O$ | 1-35 |
| OD agent | 0.01-10 |
| halide | 0-10 | and essentially no transition metals having 1-4 d-electrons in the atomic state, wherein RO is MgO, CaO, SrO, BaO, ZnO and/or PbO,
$R_2O$ is $Li_2O$, $Na_2O$, $K_2O$, $Rb_2O$ and/or $Cs_2O$,
halide is Cl, F, Br and/or I,
OD agent is one or more metals which do not possess 1-4 d-electrons in the atomic state and which can have at least two stable oxidation states other than the atomic state in silicate glasses,
at least one surface of said article having a substantially continuous silver and hydration content over its area, effective to render said surface darkenable upon exposure to electron beam radiation but substantially not thermoplastic,
said article having been substantially darkened by electron beam irradiation over at least a portion of at least one surface thereof,
and said article having geometric characteristics suitable for functioning as either a photomask reticle or an archival storage medium,
comprising heating said article to a temperature effective for said erasure.

* * * * *